US007907032B2

(12) United States Patent
Yamamoto et al.

(10) Patent No.: US 7,907,032 B2
(45) Date of Patent: Mar. 15, 2011

(54) DIRECTIONAL COUPLER

(75) Inventors: Kazuya Yamamoto, Tokyo (JP); Miyo Miyashita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 181 days.

(21) Appl. No.: 12/464,919

(22) Filed: May 13, 2009

(65) Prior Publication Data

US 2010/0171564 A1 Jul. 8, 2010

(30) Foreign Application Priority Data

Jan. 6, 2009 (JP) ................................ 2009-000874

(51) Int. Cl.
*H01P 5/18* (2006.01)
*H03H 11/16* (2006.01)

(52) U.S. Cl. .......................... 333/116; 333/156; 333/164

(58) Field of Classification Search .................. 333/109, 333/110, 111, 112, 115, 116, 156, 164
See application file for complete search history.

(56) References Cited

U.S. PATENT DOCUMENTS

| | | | | |
|---|---|---|---|---|
| 5,666,090 | A * | 9/1997 | Tsuruoka | 333/116 |
| 6,756,859 | B2 * | 6/2004 | Kodim | 333/101 |
| 7,218,186 | B2 * | 5/2007 | Chen | 333/116 |
| 7,394,333 | B2 * | 7/2008 | Ezzeddine et al. | 333/109 |
| 7,821,352 | B1 * | 10/2010 | Sanvoravong et al. | 333/116 |

FOREIGN PATENT DOCUMENTS

| | | | |
|---|---|---|---|
| JP | 2-98534 | U | 8/1990 |
| JP | 5-41206 | U | 6/1993 |
| JP | 9-64601 | A | 3/1997 |
| JP | 63-102303 | U | 7/1998 |
| JP | 2002-280811 | A | 9/2002 |
| JP | 2004-320408 | A | 11/2004 |
| JP | 2005-203824 | A | 7/2005 |
| JP | 2006-186838 | A | 7/2006 |
| JP | 2007-194870 | A | 8/2007 |

OTHER PUBLICATIONS

Chen, J. et al.; "A High-Directivity Microstrip Directional Coupler With Feedback Compensation", *2002 IEEE MTT-S Intl. Microwave Symposium Digest*, vol. 1, pp. 101-104, Seattle, WA (Jun. 2-7, 2002).

* cited by examiner

*Primary Examiner* — Dean O Takaoka
(74) *Attorney, Agent, or Firm* — Leydig, Voit & Mayer, Ltd.

(57) ABSTRACT

A directional coupler includes a main line connected at a first end to an input port and at a second end to an output port, a coupled line connected at a first end to a coupled port and at a second end to an isolated port, and a phase shifter connected at a first end to the isolated port and at a second end to the coupled port. The phase shifter phase shifts a second reflected wave component such that the second reflected wave component is opposite in phase to a first reflected wave component, the second reflected wave component traveling from the output port to the coupled port through the isolated port and the phase shifter, the first reflected wave component traveling from the output port to the coupled port through the coupled line.

16 Claims, 22 Drawing Sheets

PRIOR ART

DIRECTIONAL COUPLER

BACKGROUND OF THE INVENTION

1. Field of the Invention

The present invention relates to a directional coupler having a main line and a coupled line.

2. Background Art

It is common for a wireless terminal to include a directional coupler to monitor the level of its transmission power. FIG. 36 shows a typical configuration of a directional coupler. Referring to FIG. 36, a main line 500 is a line for transmitting transmission power and is connected between an input port (#1) and an output port (#2). On the other hand, a coupled line 502 is provided to couple out a portion of the transmission power in the main line 500 and is connected between a coupled port (#3) and an isolated port (#4). It should be noted that some directional couplers are formed in a spiral shape to reduce their overall dimensions (see FIG. 37). The performance of a directional coupler is measured by its directivity, which is defined as the ratio of its coupling to isolation. The higher the directivity, the less the influence of the reflected wave from the output port when the power transmitted from the input port to the output port is coupled out to the coupled port. The coupling and isolation of a directional coupler are often frequency dependent, e.g., as shown in FIG. 38 in which the symbol Dir indicates directivity.

A directional coupler is inserted, e.g., between a transmit power amplifier and an antenna, and used, e.g., in a cellular phone unit as shown in FIG. 39. In FIG. 39, the BB-LSI is the core component of the cellular phone unit and exchanges voice and data with an external device and performs signal processing. Further, the RF/IF-IC shown in FIG. 39 is an IC, and receives the transmission signal from the BB-LSI, frequency converts it to a high frequency signal, and supplies the high frequency signal to an amplifier (PA). The RF/IF-IC also receives the received signal from an antenna (ANT), converts it to an intermediate frequency signal, and supplies the intermediate frequency signal to the BB-LSI. The directional coupler is series connected in the transmission line for the transmission signal. The signal appearing on the coupled port of the directional coupler is delivered through a capacitor Cc to a detector DET. This signal is further delivered from the detector to the BB-LSI and provides information for monitoring and controlling the output level of the amplifier.

Thus, since the directional coupler is used to monitor the output level (or output power) of the amplifier, it is desired that the coupled out signal from the coupled port accurately reflect the output level of the amplifier without error. FIG. 40 is a graph showing the relationship between the directivity of the directional coupler and the error in the power measurement by the detector. Generally, a directional coupler must have a directivity of approximately 20 dB or higher to ensure a measurement error of 0.5 dB or less.

For example, Japanese Utility Model Laid-Open Patent Publication No. 02-098534 (1990) discloses a directional coupler with improved directivity. Specifically, this directional coupler includes a wave combiner in which the multiple reflected wave component included in the transmission wave is cancelled out with a wave obtained by phase adjusting the reflected wave, thereby improving the directivity.

However, the configuration disclosed in this patent publication does not permit miniaturization of the directional coupler (i.e., does not allow for a reduction in the circuit size). Another way to improve the directivity of a directional coupler is to make the coupling length between the main line and the coupled line equal to one-quarter wavelength ($\lambda/4$) of the operating frequency. However, for example, cellular phone units use 0.8-5 GHz bands. Such low frequencies mean large values of $\lambda/4$, making it impossible to reduce the size of the directional coupler if the coupling length between the main line and the coupled line is made equal to $\lambda/4$. Further, in the case of directional couplers using a relatively expensive substrate, such as a GaAs substrate, which provides for improved characteristics, there is great need to reduce the size of the couplers in order to reduce the manufacturing cost. This means that even if they use frequency bands higher than the above 0.8-5 GHz bands, it may not be possible to achieve a coupling length of $\lambda/4$, resulting in insufficient directivity.

SUMMARY OF THE INVENTION

The present invention has been made to solve the above problems. It is, therefore, an object of the present invention to provide a small compact directional coupler in which the coupling length between the main line and the coupled line is shorter than $\lambda/4$ of the operating frequency of the coupler, yet which has high directivity.

According to one aspect of the present invention, A directional coupler includes a main line formed on a substrate and connected at one end to an input port and at the other end to an output port, a coupled line formed on the substrate and extending along the main line, the coupled line being connected at one end to a coupled port and at the other end to an isolated port, the one end of the coupled line being located at the same side of the directional coupler as the input port, the other end of the coupled line being located at the same side of the directional coupler as the output port, and a phase shifter connected at one end to the isolated port and at the other end to the coupled port. The coupling length between the main line and the coupled line is shorter than one-quarter wavelength of the frequency of power transmitted from the input port to the output port. The phase shifter phase shifts a second reflected wave component such that the second reflected wave component is opposite in phase to a first reflected wave component, the second reflected wave component traveling from the output port to the coupled port through the isolated port and the phase shifter, the first reflected wave component traveling from the output port to the coupled port through the coupled line.

Other and further objects, features and advantages of the invention will appear more fully from the following description.

DETAILED DESCRIPTION OF THE PREFERRED EMBODIMENTS

First Embodiment

A first embodiment of the present invention will be described with reference to FIGS. 1 to 10. It should be noted that throughout the description of the first embodiment, like numerals represent like materials or like or corresponding components, and these materials and components may be described only once. This also applies to other embodiments of the invention subsequently described.

Figure 1:
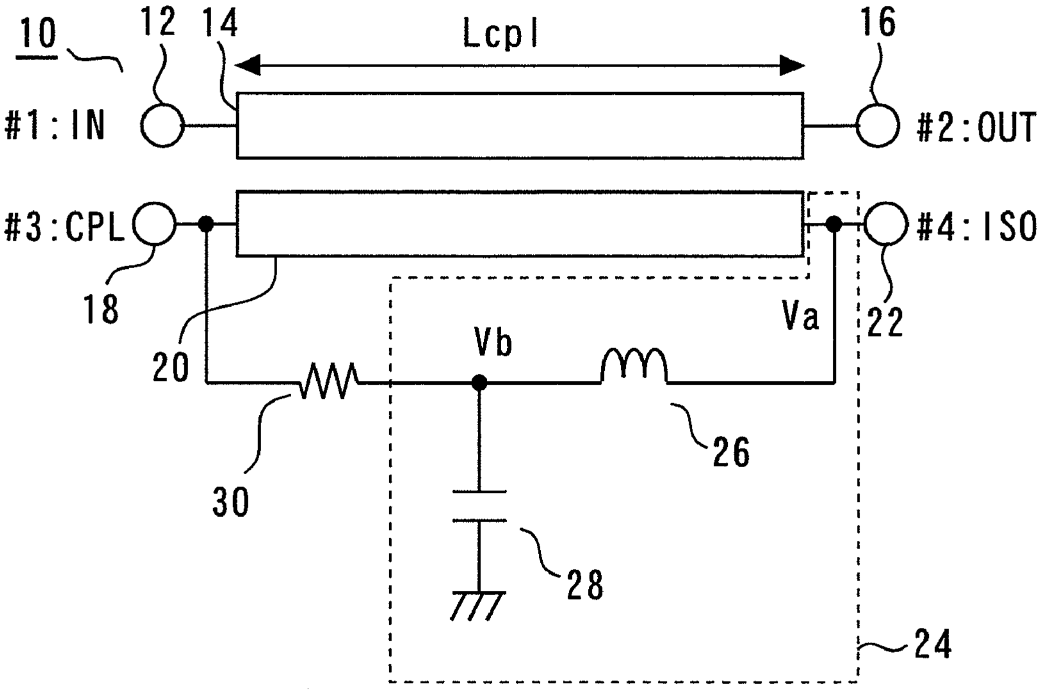
FIG. 1 is a diagram illustrating a directional coupler of the first embodiment.

FIG. 1 is a diagram illustrating a directional coupler of the present embodiment. This directional coupler and those of other embodiments described below are loosely laterally coupled directional couplers. Referring to FIG. 1, the directional coupler 10 of the present embodiment includes a main line 14 formed on a substrate. One end of the main line 14 is connected to an input port 12, and the other end is connected to an output port 16. The main line 14 transmits transmission power (a forward wave) from the input port 12 to the output port 16. A coupled line 20 is formed on the substrate and extends along the main line 14. One end of the coupled line 20 is connected to a coupled port 18, and the other end is connected to an isolated port 22. The coupled line 20 is used to couple out a portion of the power transmitted in the main line 14.

As shown in FIG. 1, the input port 12 and the coupled port 18 are disposed at the same side of the directional coupler. Further, the output port 16 and the isolated port 22 are disposed at the side of the directional coupler opposite the input port 12 and the coupled port 18. In FIG. 1, reference numeral Lcp1 denotes the coupling length between the main line 14 and the coupled line 20. According to the present embodiment, the coupling length Lcp1 is relatively short, namely, one tenth ($1/10$) to one twentieth ($1/20$) of $\lambda/4$, where $\lambda$ is the wavelength of the frequency of the power transmitted through the main line of the directional coupler 10.

The directional coupler 10 of the present embodiment also includes a phase shifter 24 connected at one end to the isolated port 22 and connected at the other end to the coupled port 18 through a resistance 30. The phase shifter 24 substantially inverts the phase of the reflected wave from the output port 16 and supplies the inverted wave to the coupled port 18, as described later. The phase shifter 24 includes a inductor 26 and a capacitor 28. One end of the inductor 26 is connected to the isolated port 22, and the other end is connected to the coupled port 18 through the resistance 30. One end of the capacitor 28 is connected to the other end of the inductor 26, and the other end of the capacitor 28 is grounded. This completes the description of the configuration of the directional coupler 10 of the present embodiment.

The phase shifter 24 phase shifts the reflected wave component traveling from the output port 16 to the coupled port 18 through the isolated port 22 and the phase shifter 24 such that this reflected wave component is opposite in phase to the reflected wave component traveling from the output port 16 to the coupled port 18 through the coupled line 20. (The former reflected wave component is referred to herein as the “second reflected wave component,” and the latter is referred to herein as the "first reflected wave component.") This phase shift is caused by the resonance of the phase shifter 24.

Figure 2:
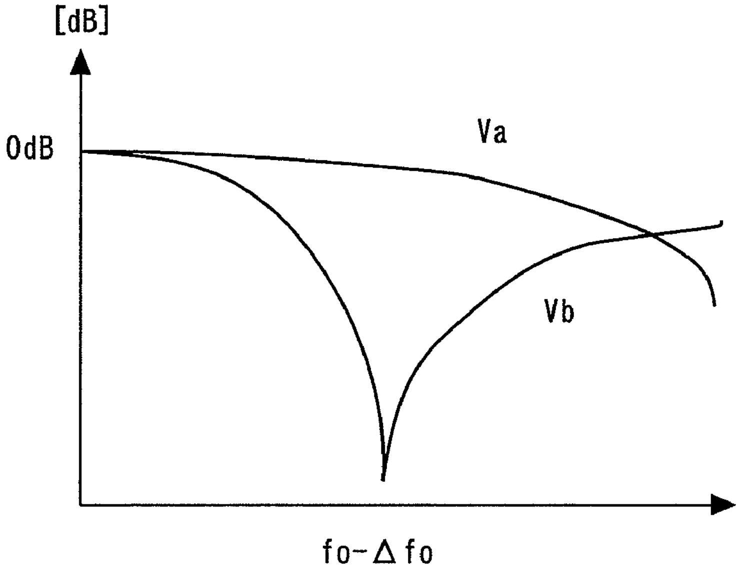
FIG. 2 is a diagram illustrating the potential Va at one end of the inductor and the potential Vb at one end of the capacitor.

FIG. 2 is a diagram illustrating the potential Va at one end of the inductor 26 and the potential Vb at one end of the capacitor 28, i.e., at the other end of the inductor 26, as a function of frequency (see also FIG. 1). As shown in FIG. 2, the LC circuit of the phase shifter 24 is designed to resonate at f0-Δf0, where f0 is the frequency of the power transmitted through the main line and Δf0 is a frequency shift determined so that the second reflected wave is opposite in phase to the first reflected wave. More specifically, in the present embodiment, a phase difference of approximately 5-10° occurs between the potentials at the isolated port 22 and the coupled port 18 since the coupling length Lcp1 is short. Therefore, the resonant frequency of the phase shifter 24 is shifted from the frequency of the transmitted power by Δf0 to compensate for this phase difference. The value of Δf0 is around 5-10°.

Figure 3:
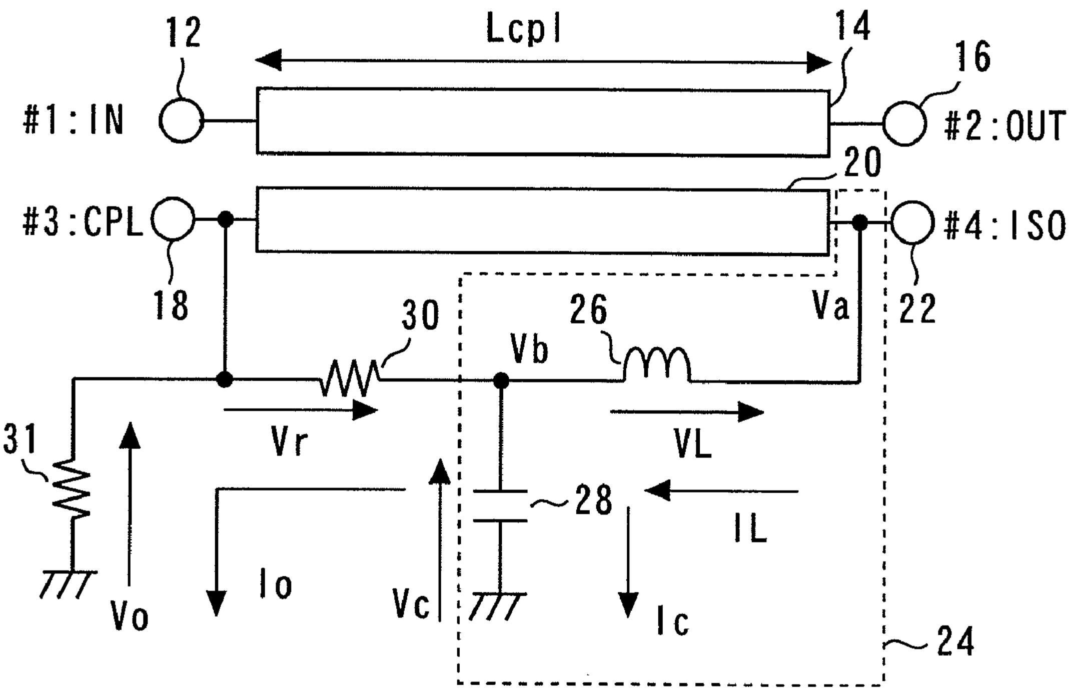
FIG. 3 is a diagram showing currents and voltages at selected locations in a directional coupler of the first embodiment.

With reference to FIGS. 3 to 7, the following describes how the phase shifter 24 functions to make the second reflected wave opposite in phase to the first reflected wave. FIG. 3 is a diagram showing currents and voltages at selected locations in a directional coupler of the present embodiment, wherein these currents and voltages are indicated by different symbols. The directional coupler shown in FIG. 3 is similar to the directional coupler 10 shown in FIG. 1, except that it additionally includes a terminating resistance 31 (approximately 50Ω) connected to the coupled port 18.

Figure 4:
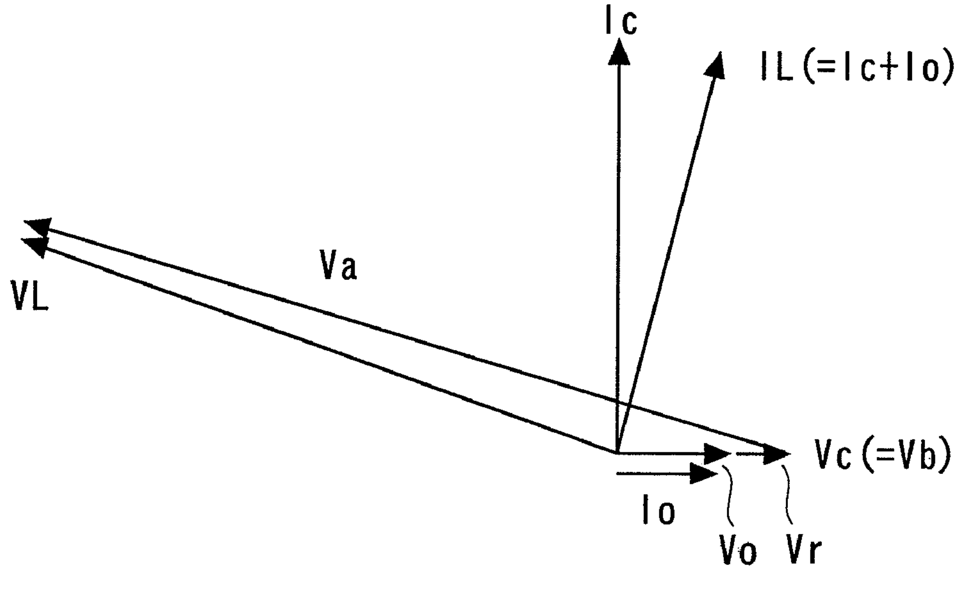
FIG. 4 shows that the voltage Vo of the reflected wave component traveling through the phase shifter is substantially opposite in phase to the voltage Va at the isolated port.
Figure 5:
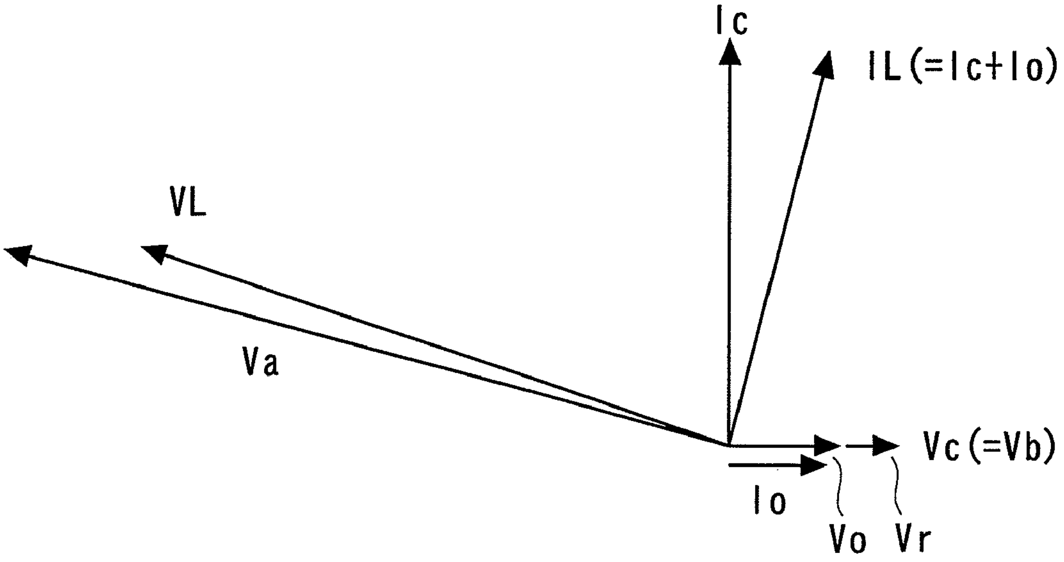
FIG. 5 shows that the voltage Vo of the reflected wave component traveling through the phase shifter is substantially opposite in phase to the voltage Va at the isolated port.

FIGS. 4 to 7 are vector diagrams showing the currents and voltages indicated by symbols in FIG. 3. FIGS. 4 and 5 show that the voltage Vo of the reflected wave component traveling through the phase shifter 24, as measured at the coupled port 18, is substantially opposite in phase to the voltage Va at the isolated port 22. It should be noted that this reflected wave component corresponds to the second reflected wave component described above.

Figure 6:
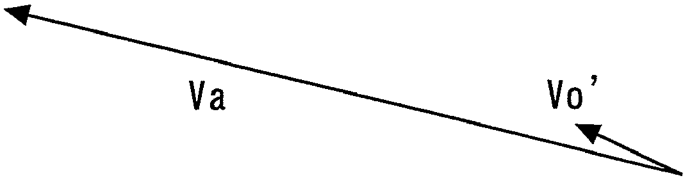
FIG. 6 shows the voltage Va at the isolated port when the directional coupler does not have the phase shifter.

FIG. 6 shows the voltage Va at the isolated port 22 when the directional coupler does not have the phase shifter 24, and also shows the voltage Vo' of the reflected wave component traveling through the coupled line 20 to the coupled port 18 (without passage through the phase shifter 24) as it appears at the coupled port 18. This reflected wave component corresponds to the first reflected wave component described above. The voltages Va and Vo' have a phase difference of approximately 5-10°, as described above.

Figure 7:
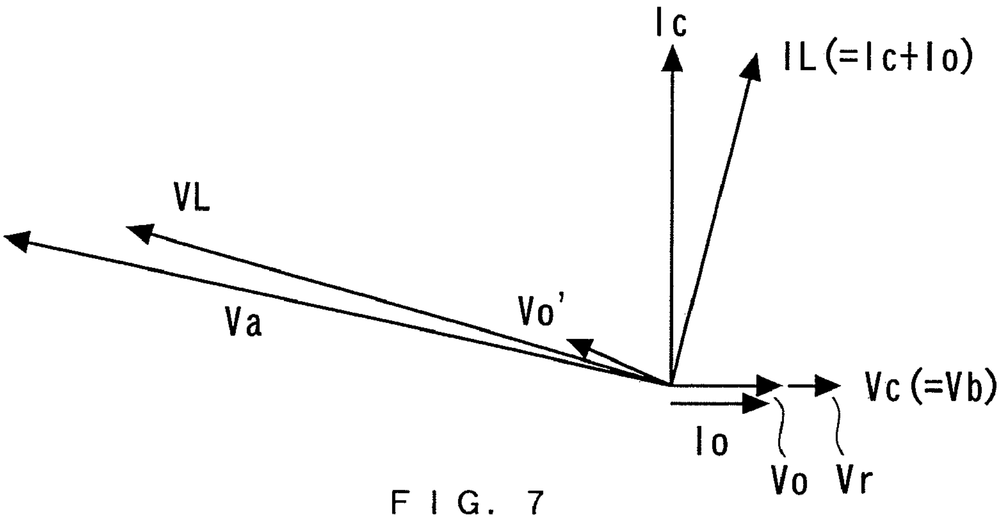
FIG. 7 is a combination of FIGS. 5 and 6 and shows that Vo and Vo' are substantially opposite in phase to each other.

FIG. 7 is a combination of FIGS. 5 and 6 and shows that Vo and Vo' are substantially opposite in phase to each other. Thus, the circuit constants of the phase shifter 24 can be adjusted so that Vo (the second reflected wave component) is opposite in phase to Vo' (the first reflected wave component). Further, Vo and Vo' preferably have equal amplitudes in order to ensure that the directional coupler has high directivity. According to the present embodiment, the resistance 30 acts to reduce the voltage Vb at the ungrounded end of the capacitor 28 so that Vo and Vo' have equal amplitudes. Specifically, Vo is equal to Vb minus the voltage Vr across the resistance 30, as can be seen from the vector diagram of FIG. 7. Thus, Vo can be adjusted such that Vo and Vo' have equal amplitudes and cancel out each other, as shown in FIG. 7.

Generally, the performance of a directional coupler is determined by its coupling, isolation, and directivity. In the case of the directional couplers shown in FIGS. 1 and 3, the coupling means the degree to which the coupled port 18 is coupled to the input port 12. More specifically, the coupling is the signal input to the coupled port 18 divided by the signal input to the input port 12 and is typically approximately −10 dB to −20 dB. The isolation means the degree to which the reflected wave from the output port 16 is coupled to the coupled port 18. Specifically, the isolation is the signal power of the reflected wave input to the coupled port 18 divided by the power of the reflected wave output from the output port 16 and is typically approximately −15 dB to −30 dB. The directivity is the ratio of the coupling to the isolation.

The higher the directivity, the less the influence of the reflected wave from the output port 16 and hence the less the error the directional coupler makes in detecting the transmission power. That is, the wave detecting circuit can accurately monitor the transmission power (or forward wave power) even under load variations. As a result, the error in the detected voltage due to the reflected wave is reduced, thereby reducing the distortion components generated when the amplifier (PA) produces excessive transmission power in response to load variations.

However, there is a need to reduce the size of directional couplers. If, in order to satisfy this need, the coupling length between the main line and the coupled line in prior art directional couplers is reduced to less than λ/4, a reduction in the directivity results.

Figure 8:
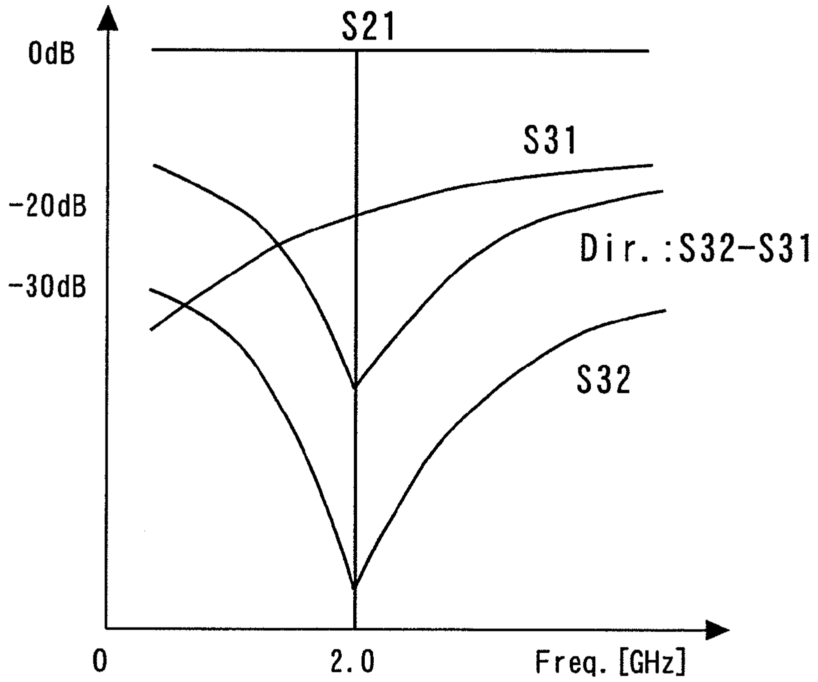
FIG. 8 is a graph illustrating various characteristics of the directional coupler of the first embodiment as a function of frequency.

On the other hand, the present embodiment allows a directional coupler to have high directivity even if its coupling length is shorter than λ/4. FIG. 8 is a graph illustrating various characteristics of the directional coupler of the present embodiment as a function of frequency. In FIG. 8, reference numeral S31 indicates the coupling vs frequency characteristic, S32 indicates the isolation vs frequency characteristic, and S32-S31 indicates the directivity vs frequency characteristic. Since, as described above, the phase shifter 24 phase shifts the second reflected wave such that this reflected wave is opposite in phase to the first reflected wave, the isolation (dB) is high over a frequency range around 2 GHz, as indicated by the isolation vs frequency characteristic S32. More specifically, the directional coupler of the present embodiment has high directivity (namely, approximately 30 dB) at frequencies around 2 GHz.

Thus the directional coupler of the present embodiment has high directivity at frequencies around 2 GHz, which makes it suitable for use in devices for narrow band communications such as radio communications. Various alterations may be made to the directional coupler of the present embodiment. Several variations of the directional coupler of the present embodiment will now be described with reference to FIGS. 9 and 10.

Figure 9:
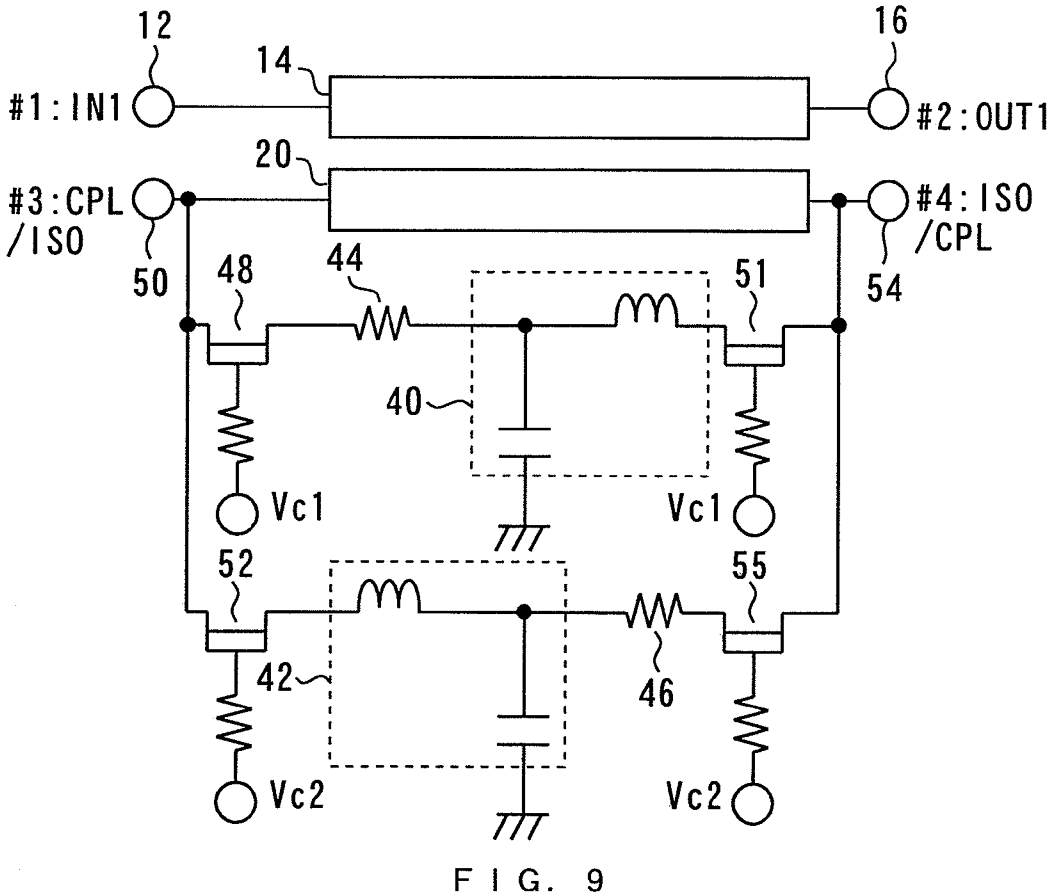
FIG. 9 shows a directional coupler including two phase shifters adapted for transmission in opposite directions.

FIG. 9 shows a directional coupler including two phase shifters adapted for transmission in opposite directions. The directional coupler shown in FIG. 9 is characterized in that power can be transmitted both from the input port to the output port and from the output port to the input port (i.e. bidirectional transmission). Referring to FIG. 9, one end of a first phase shifter 40 is connected to the isolated port 54 through a first transistor 51, and the other end of the first phase shifter 40 is connected to the coupled port 50 through a resistance 44 and a second transistor 48. On the other hand, one end of a second phase shifter 42 is connected to the coupled port 50 through a third transistor 52, and the other end of second phase shifter 42 is connected to the isolated port 54 through a resistance 46 and a fourth transistor 55. When power is transmitted from the input port 12 to the output port 16, the first and second transistors 51 and 48 are turned on and the third and fourth transistors 52 and 55 are turned off. When power is transmitted from the output port 16 to the input port 12, on the other hand, the first and second transistors 51 and 48 are turned off and the third and fourth transistors 52 and 55 are turned on. Such control of the phase shifters allows the directional coupler to accommodate bidirectional power transmission while achieving the advantages of the present embodiment using a phase shifter. It should be noted that the configurations of the first and second phase shifters 40 and 42 are similar to that of the phase shifter 24 described above in connection with the present embodiment, and therefore these phase shifters will not be described in detail herein.

Figure 10:
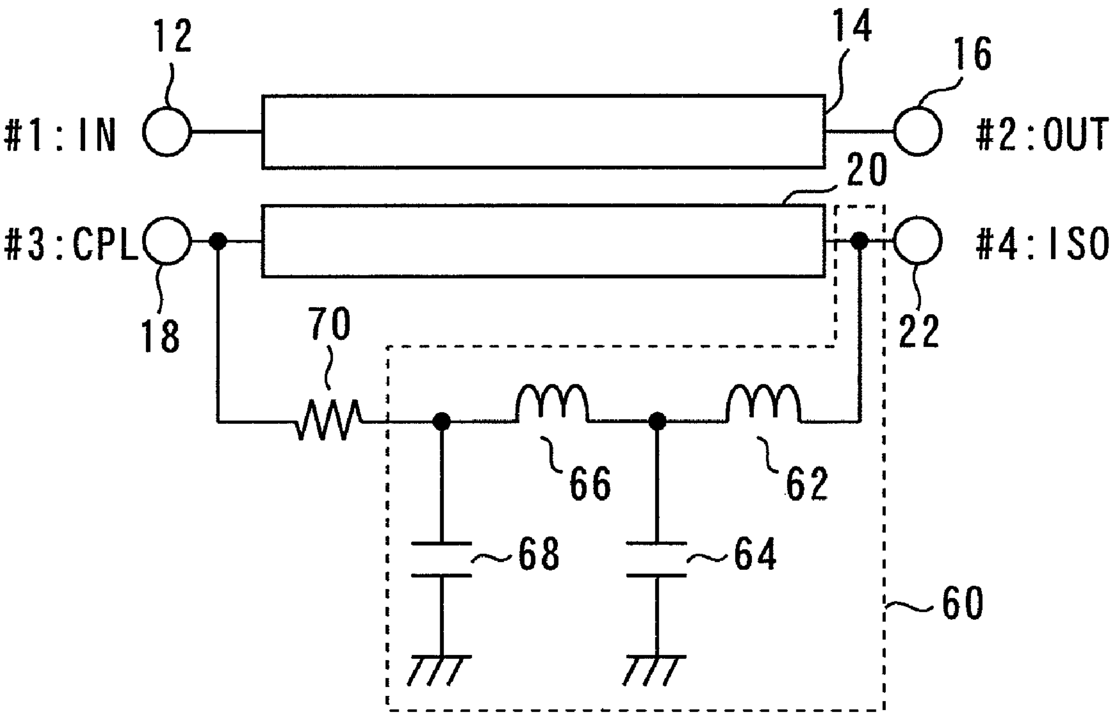
FIG. 10 shows a directional coupler having a construction which facilitates its design.

FIG. 10 shows a directional coupler having a construction which facilitates its design. Referring to FIG. 10, the phase shifter 60 in the directional coupler has substantially the same function as the phase shifter 24 of FIG. 1 described above. However, the phase shifter 60 includes a first phase shifting portion made up of a first inductor 62 and a first capacitor 64 and a second phase shifting portion made up of a second inductor 66 and a second capacitor 68. This arrangement facilitates design of the directional coupler, since an LC circuit is usually used to provide a phase shift of 90°. Furthermore, it is possible to increase the frequency range over which the directivity is high.

Various other alterations may be made to the directional coupler of the present embodiment. For example, although in the present embodiment the directional coupler has high directivity (namely, approximately 30 dB) at frequencies around 2 GHz, it is to be understood that the frequency range over which the coupler has high directivity can be varied arbitrarily by varying the circuit constants (or resonant frequency) of the phase shifter 24 described with reference to FIG. 2. Further, as described above, the resistance 30 is provided primarily to make the voltages Vo and Vo' equal in amplitude. This means that the resistance 30 may be omitted if these voltages Vo and Vo' have equal or only slightly different amplitudes without the resistance 30. Further, the coupling length may be any length shorter than one-quarter wavelength of the operating frequency (λ/4), since in such a case the present embodiment enables the directional coupler to have improved directivity.

Second Embodiment

A second embodiment of the present invention relates to a directional coupler that includes a phase shifter using a variable capacitor. The present embodiment will be described with reference to FIGS. 11 to 13. The directional coupler of the present embodiment is substantially similar to that of the first embodiment, except that it includes a different phase shifter 80 which will be described below with reference in FIG. 11.

The phase shifter 80 includes a capacitor 82 connected at one end to the inductor 26 and at the other end to ground. The phase shifter 80 also includes a capacitor 84 connected at one end to the one end of the capacitor 82 and at the other end to a diode 86 (described below). The phase shifter 80 also includes the diode 86 connected at its anode to ground and at its cathode to the other end of the capacitor 84. A voltage source is connected through a resistance 88 to the cathode of the diode 86 to supply a control voltage Vc thereto.

The diode 86 of the directional coupler can be regarded as a combination of a resistance and a variable capacitor. According to the present embodiment, the control voltage Vc is varied to vary the capacitance of the diode 86 (acting as a variable capacitor), thereby adjusting the resonant frequency of the phase shifter 80. That is, the frequency range over which the directional coupler has high directivity can be shifted by varying the control voltage Vc.

Figure 11:
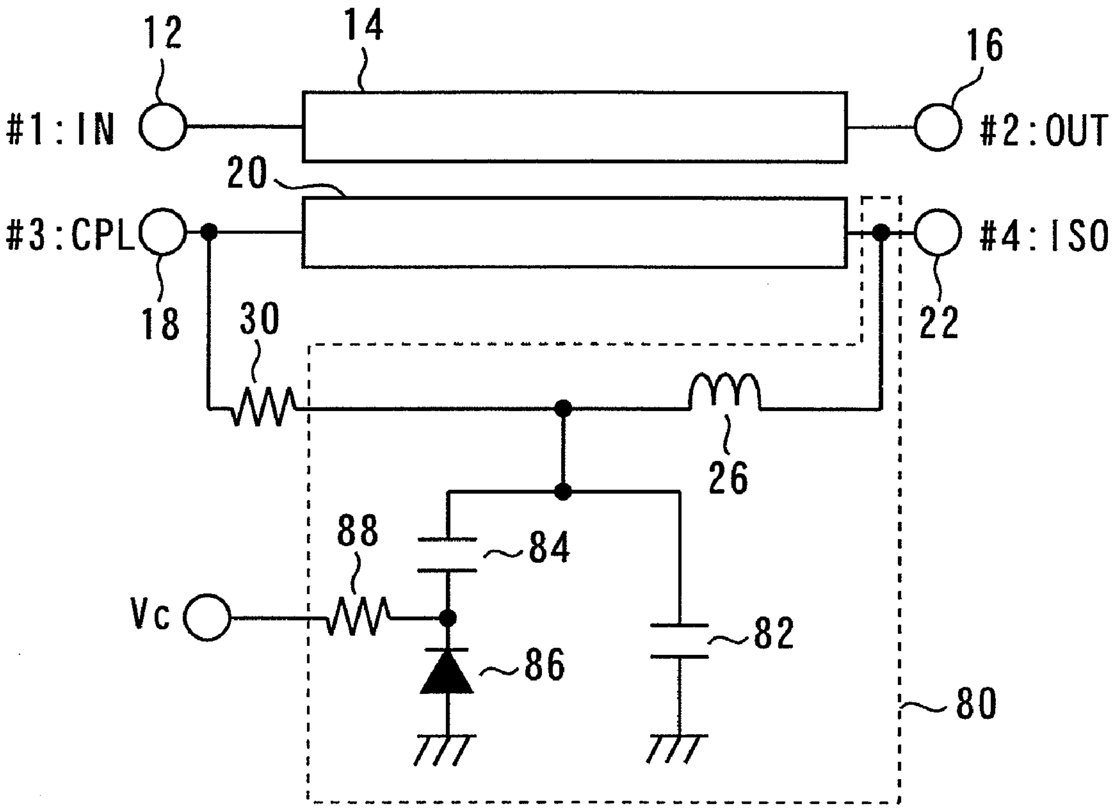
FIG. 11 is a diagram illustrating a directional coupler of the second embodiment.
Figure 12:
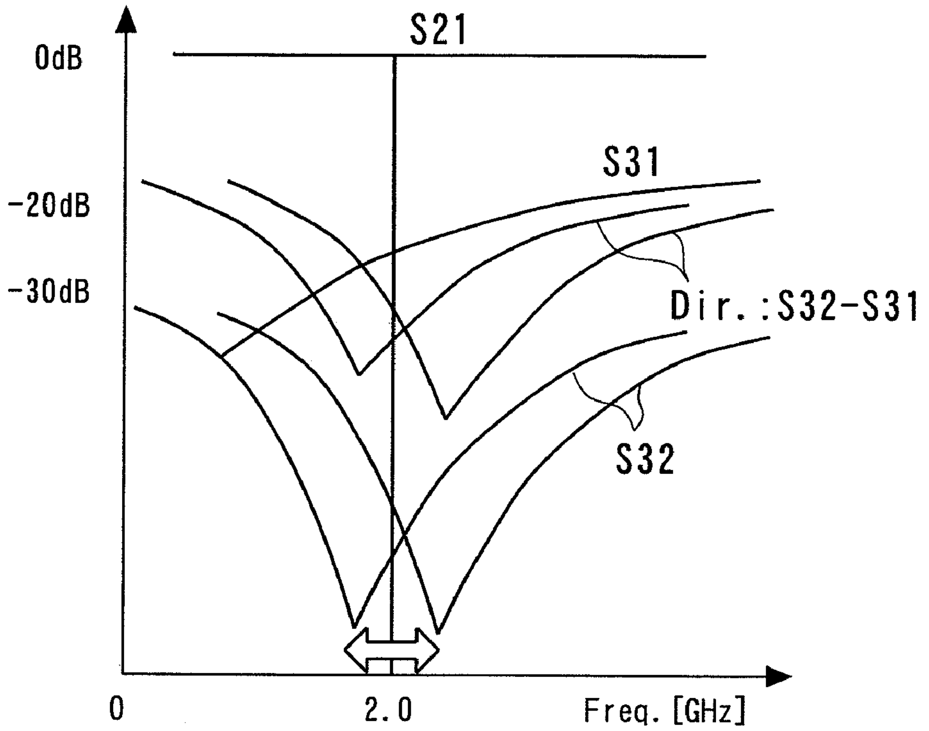
FIG. 12 is a graph illustrating various characteristics of the directional coupler of FIG. 11 as a function of frequency.

FIG. 12 is a graph illustrating various characteristics of the directional coupler of FIG. 11 as a function of frequency. The resonant frequency of the phase shifter may be varied to vary the frequency range over which the directional coupler has high directivity, as indicated by the arrow in FIG. 12. This may be accomplished by varying the control voltage Vc and thereby adjusting the capacitance of the diode 86, as described above. This directional coupler is especially suitable as a multiband directional coupler (i.e., a directional coupler for use at a plurality of different frequencies). The control voltage applying means for applying the control voltage Vc to the cathode of the diode 86 may be connected to a circuit outside the directional coupler, which circuit sets the frequency of the power transmitted through the main line. With this arrangement, the control voltage Vc may be adjusted in accordance with the frequency of the transmission power, thereby optimizing the directivity of the directional coupler. In FIG. 11, the control voltage applying means is represented simply by a port Vc.

Figure 13:
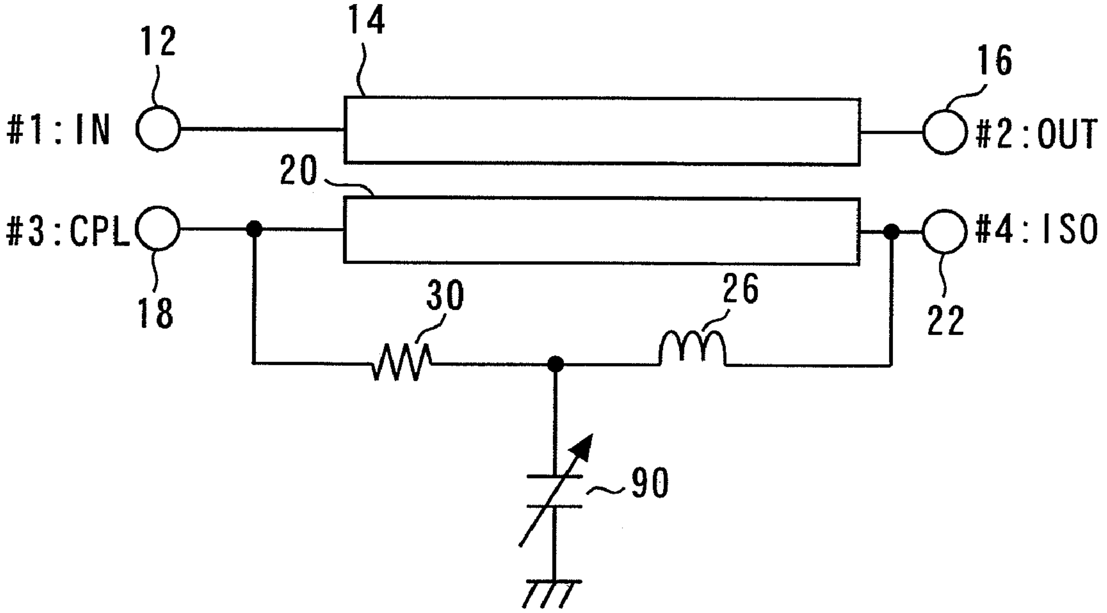
FIG. 13 shows a directional coupler including a single variable capacitor.

The variable capacitor of the present embodiment is not limited to the configuration shown in FIG. 11. Specifically, the present embodiment is characterized in that the value of a capacitance in the phase shifter is varied such that the directional coupler has high directivity at the current operating frequency. Therefore, the variable capacitor of the present embodiment may be made up of a single variable capacitor 90, as shown in FIG. 13, while retaining the advantages described above in connection with the present embodiment.

Third Embodiment

Figure 14:
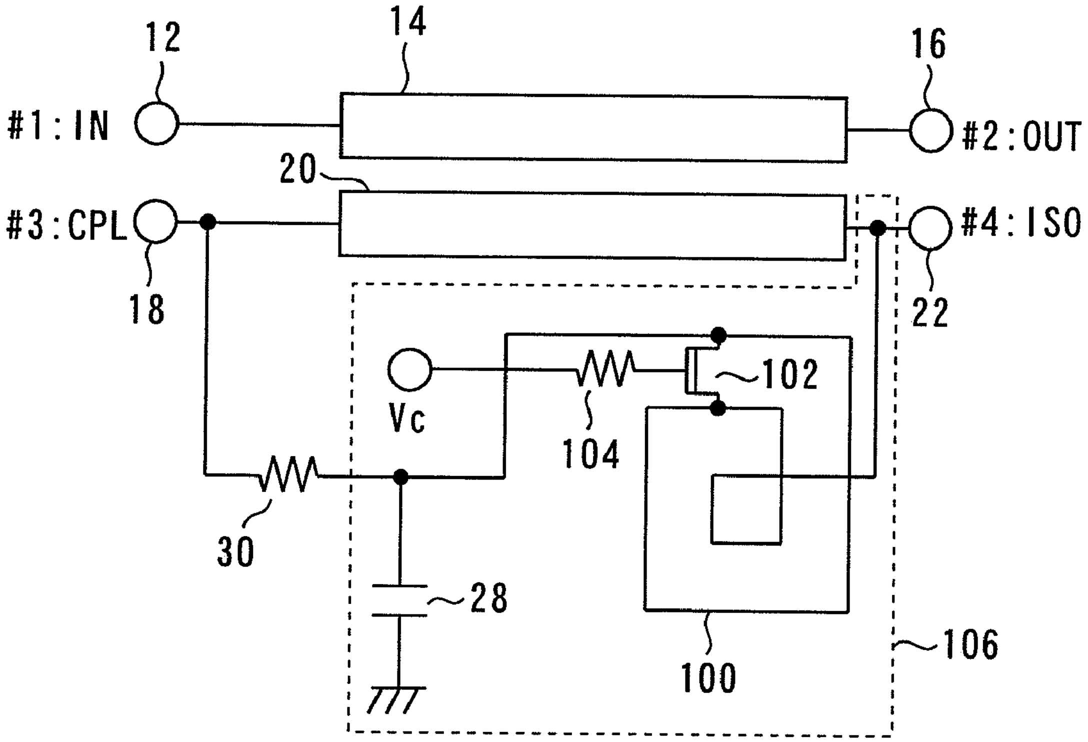
FIG. 14 is a diagram illustrating a directional coupler of the third embodiment.

A third embodiment of the present invention relates to a directional coupler that includes a phase shifter using a variable inductor. The present embodiment will be described with reference to FIGS. 14 to 16. The directional coupler of the present embodiment is substantially similar to that of the first embodiment, except that it includes a different phase shifter 106 which will be described below with reference to FIG. 14.

Figure 15:
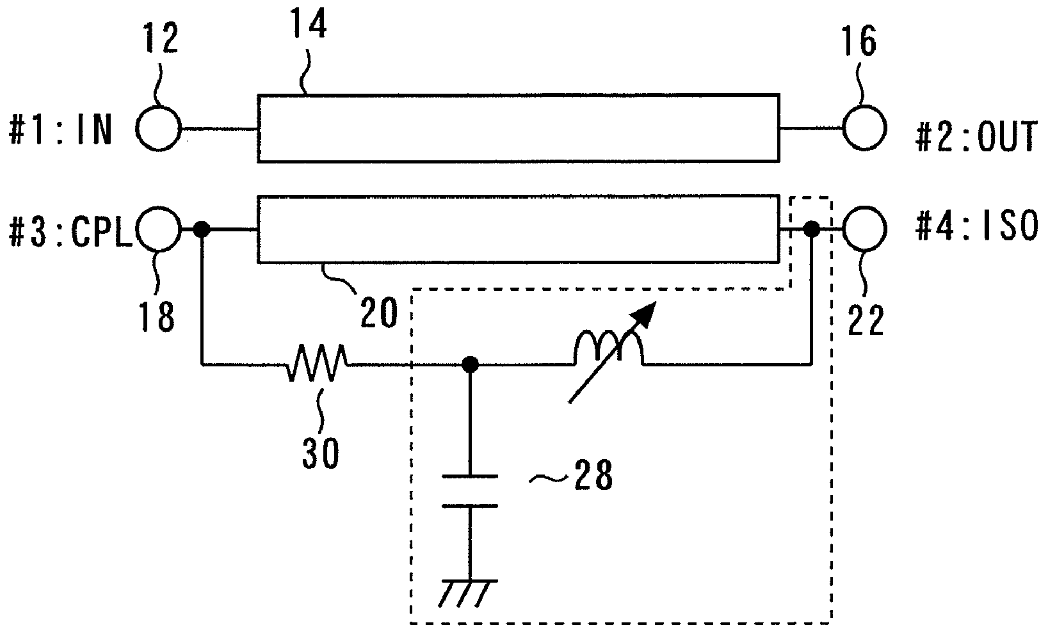
FIG. 15 shows the most generalized circuit diagram of the directional coupler of the third embodiment.
Figure 16:
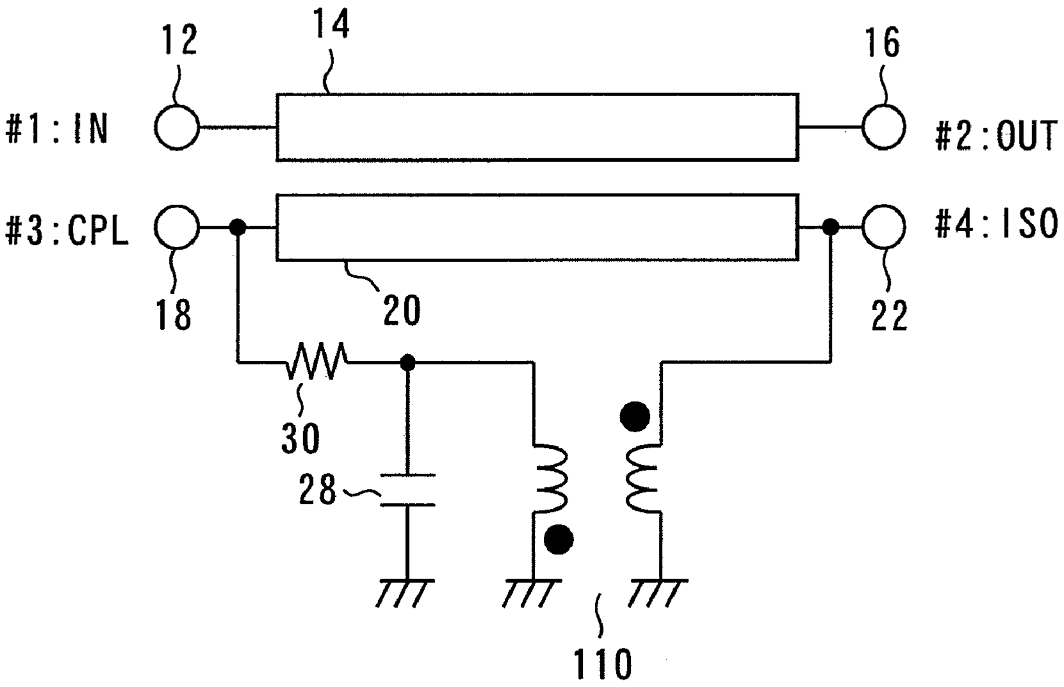
FIG. 16 shows a directional coupler including a phase inverting transformer.

An inductor 100 of the present embodiment includes a spiral line. The inductor 100 also includes a transistor 102 connected at its source to a point on the spiral line and at its drain to another point on the spiral line. In this example, the transistor 102 is an FET. However, the present invention is not limited to this particular device. The gate of the transistor 102 is controlled by a control voltage Vc. With this arrangement, the inductance of the inductor 100 can be varied by varying the control voltage Vc. This makes it possible to shift the frequency range over which the directional coupler has high directivity, as in the second embodiment. As in the second embodiment, the control voltage applying means for applying the control voltage Vc may be connected to an appropriate control circuit outside the directional coupler in order to make the coupler suitable for use as a multiband directional coupler. The details of such an arrangement will not be further described herein. It should be noted that in addition to the transistor 102 another transistor may be connected to the inductor to allow the directional coupler to be used in a plurality of frequency bands. FIG. 15 shows the most generalized circuit diagram of the directional coupler of the present embodiment. As indicated by this figure, the present embodiment is characterized in that the value of the inductance in the phase shifter is varied. Therefore, the inductor may be implemented by a phase inverting transformer 110, as shown in FIG. 16.

Fourth Embodiment

Figure 17:
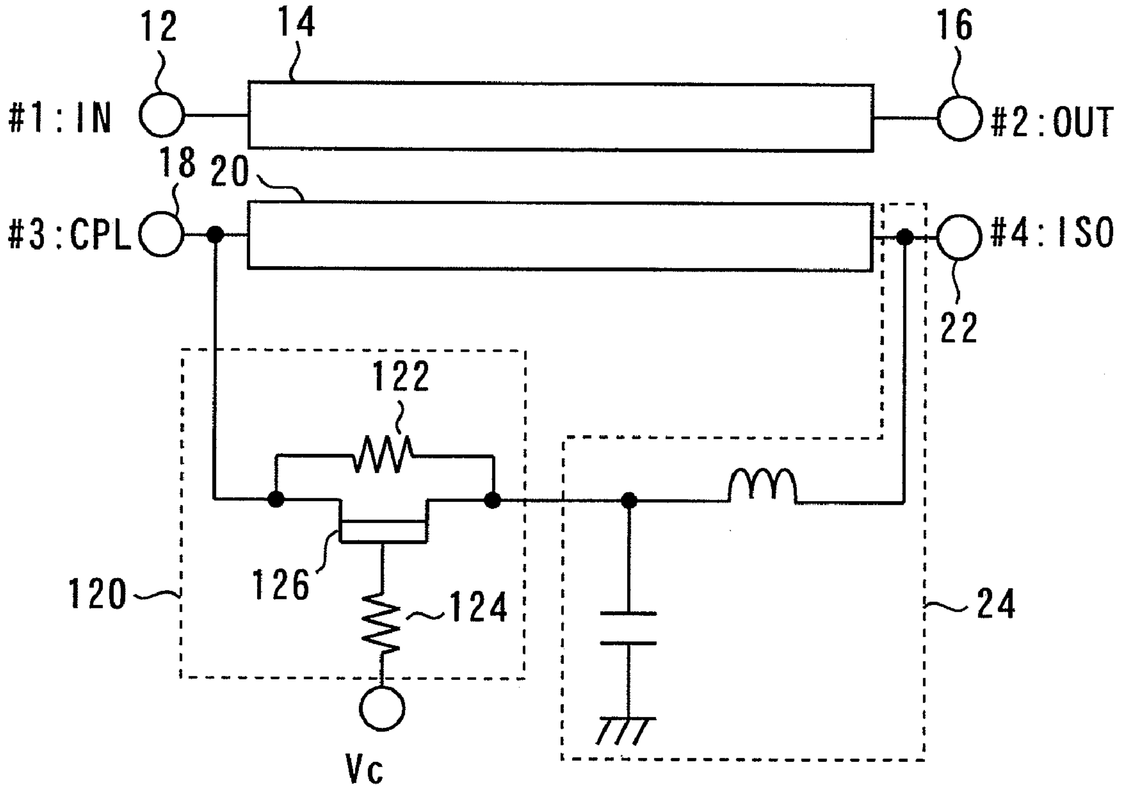
FIG. 17 is a diagram illustrating a directional coupler of the fourth embodiment.
Figure 18:
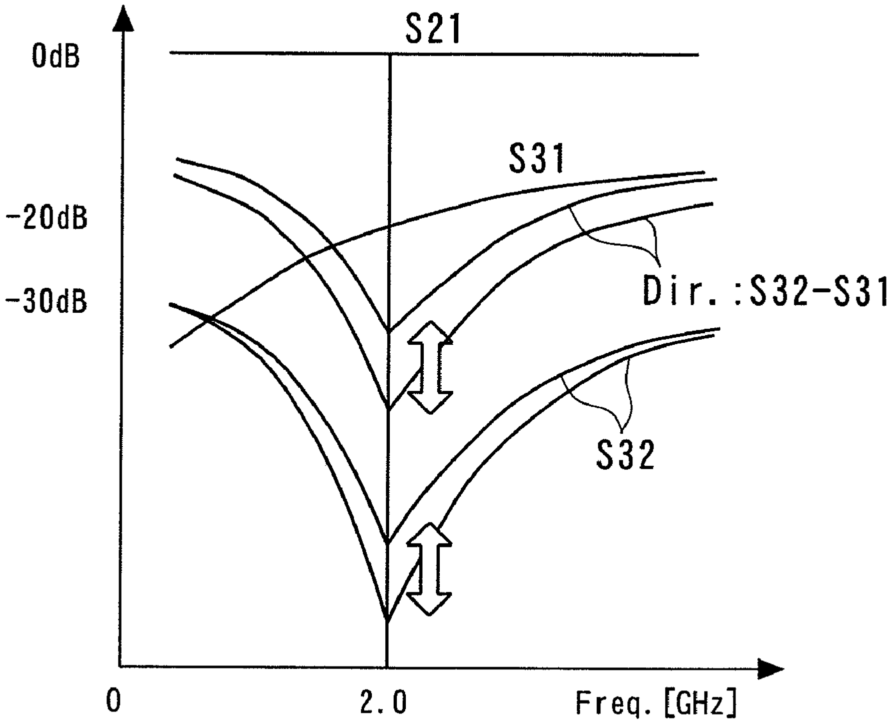
FIG. 18 is a graph illustrating various characteristics of the directional coupler of the fourth embodiment as a function of frequency.

A fourth embodiment of the present invention relates to a directional coupler in which a variable resistance is connected between the coupled port and the phase shifter. The present embodiment will be described with reference to FIGS. 17 to 19. The directional coupler of the present embodiment is substantially similar to that of the first embodiment, except that it includes, instead of the fixed resistance 30, a variable resistance 120 which will be described below with reference to FIG. 17.

Figure 19:
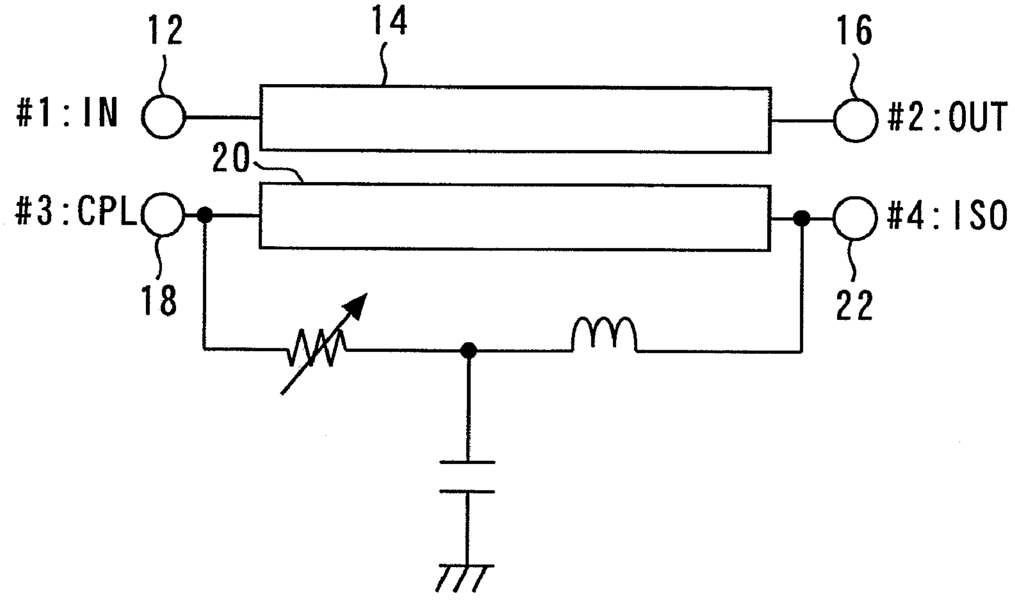
FIG. 19 shows a generalized circuit diagram of the directional coupler of the fourth embodiment.

The resistance 120 includes a transistor 126 connected between the phase shifter 24 and the coupled port 18. The channel resistance of the transistor 126 (an FET) is controlled by the control voltage Vc applied to its gate. The control voltage Vc may be varied to vary the directivity of the directional coupler, as indicated by the arrows in FIG. 18, which shows the directivity vs frequency characteristic, etc. As can be seen from FIG. 17, the resistance 122 connected in parallel to the transistor 126 allows the second reflected wave component to pass to the coupled port 18 when the transistor 126 is turned off. FIG. 19 shows a generalized circuit diagram of the directional coupler of the present embodiment.

Thus since the whole resistance 120 functions as a variable resistance, the value of the resistance 120 may be varied to make the first and second reflected waves equal in amplitude, or compensate for the difference in amplitude between these reflected waves due to manufacturing variations, even after the manufacture of the directional coupler.

Fifth Embodiment

Figure 20:
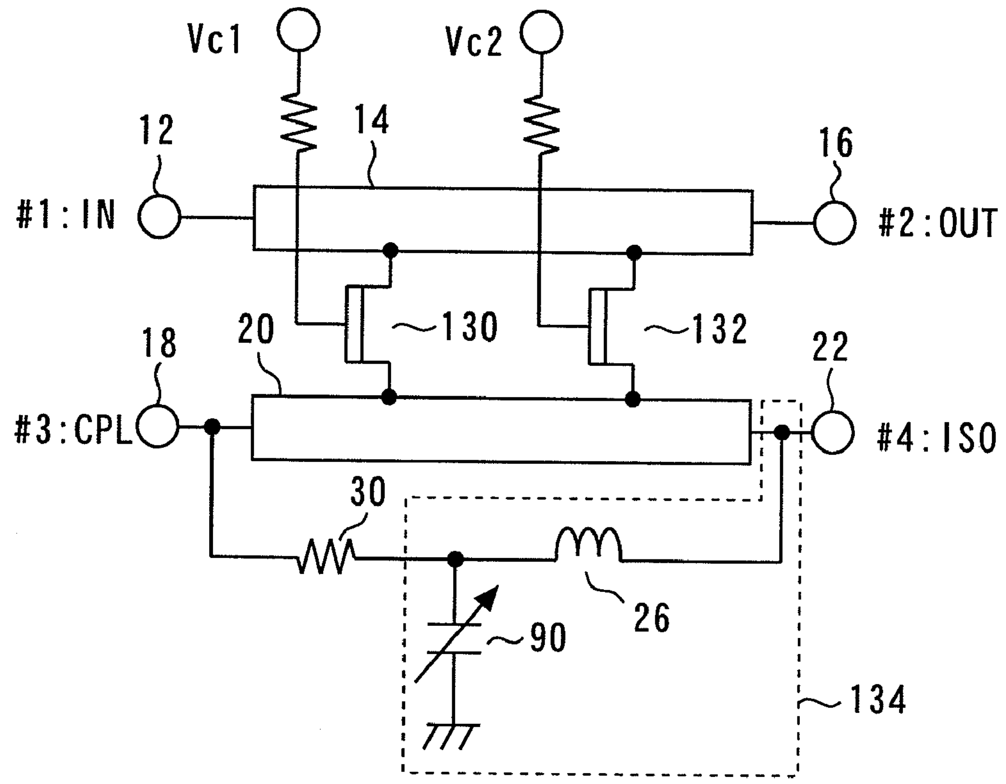
FIG. 20 is a diagram illustrating a directional coupler of the fifth embodiment.

A fifth embodiment of the present invention relates to a directional coupler for use at a plurality of different frequencies in which the degree of coupling can be varied. The present embodiment will be described with reference to FIGS. 20 and 21. The directional coupler of the present embodiment is substantially similar to that of the first embodiment, except for the following features. The main line 14 is connected to the coupled line 20 by a first field effect transistor 130 and a second field effect transistor 132, that is, the source-drain path of each field effect transistor is connected between these lines. Further, the directional coupler of the present embodiment includes a phase shifter 134 using a variable capacitor 90.

The directional coupler is provided with means for applying control voltages Vc1 and Vc2 to the gates of the first and second field effect transistors 130 and 132, respectively, to control these gates. In the directional coupler of the present embodiment, the degree of coupling between the main and coupled lines can be varied by controlling Vc1 and Vc2, i.e., by utilizing the variable capacitance characteristics of the first and second field effect transistors 130 and 132. More specifically, Vc1 and Vc2 are controlled to equalize the coupling of the directional coupler at different operating frequencies.

Figure 21:
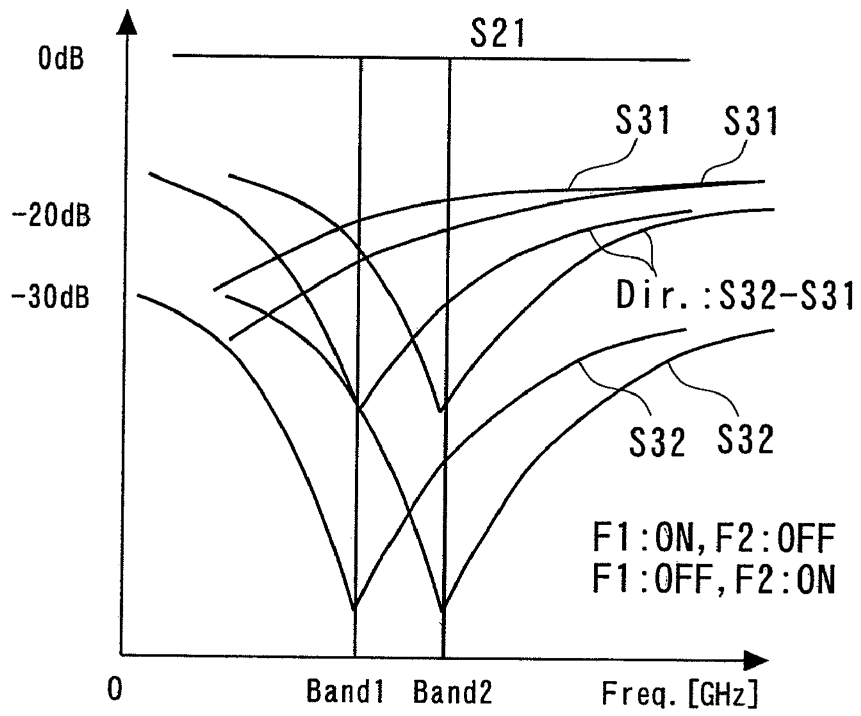
FIG. 21 shows an exemplary method of controlling the directional coupler of the fifth embodiment.

FIG. 21 shows an exemplary method of controlling the directional coupler of the present embodiment. In FIG. 21, the directional coupler is operated at two frequencies Band1 and Band2. The first field effect transistor 130 (denoted by F1 in FIG. 21) and the second field effect transistor 132 (denoted by F2 in FIG. 21) are controlled as follows. When the directional coupler is operated at the frequency Band1, F1 is turned on and F2 is turned off; when the directional coupler is operated at the frequency Band2, F1 is turned off and F2 is turned on. This control equalizes the coupling of the directional coupler at Band1 and Band2.

Generally, when, as in the present embodiment, a directional coupler is used at a plurality of different frequencies, it is preferable to equalize the coupling of the coupler at these frequencies. For example, if the coupling of the directional coupler is increased at one of these frequencies, the power coupled out to the coupled port increases and the output to the antenna decreases at that frequency, which is not desirable. That is, increasing the coupling of a directional coupler improves its directivity but increases the loss. Therefore, the coupling should preferably be lower than a certain level. Further, since the detector for detecting the output from the coupled port is designed to receive a substantially constant voltage, it is not desired that the coupling varies significantly with the frequency at which the directional coupler is operated. The present embodiment solves these problems by including a circuit for varying the coupling of the directional coupler, and equalizing the coupling at the different operating frequencies using this circuit.

When the coupling is increased, e.g., from 20 dB to 15 dB, as by increasing the drain-source capacitance of the first or second field effect transistor, the isolation decreases and as a result the directivity significantly decreases. However, the present embodiment allows this decrease in the directivity to be compensated for in a plurality of frequency bands since the phase shifter 134 includes the variable capacitor 90.

Although the present embodiment has been described as including two field effect transistors, it may include one or three or more field effect transistors while retaining the advantages of the present embodiment described above.

Sixth Embodiment

A sixth embodiment of the present invention relates to a directional coupler for use in at least a low band and a high band higher in frequency than the low band in which the coupling length can be varied. The present embodiment will be described with reference to FIG. 22. The directional coupler of the present embodiment is substantially similar to that of the first embodiment, except for the following features. The directional coupler of the present embodiment includes, instead of the coupled line 20, a first coupled line 142 and a second coupled line 144 connected to each other through the source-drain path of a first switching device 140. Further, the directional coupler includes a phase shifter 134 using a variable capacitor 90.

One end of the first coupled line 142 is connected to the isolated port 22, and the other end is connected to one end of the first switching device 140. One end of the second coupled line 144 is connected to the other end of the first switching device 140, and the other end of the second coupled line 144 is connected to the coupled port 18. Further, one end of the phase shifter 134 is connected to the one end of the second coupled line 144 through a second switching device 146.

This completes the description of the directional coupler of the present embodiment. When a directional coupler is used in a plurality of bands, it is preferable to equalize the coupling of the coupler in these bands, as described in connection with the fifth embodiment. In the case of the directional coupler of the present embodiment, which is used in at least a low band and a high band, its coupling length may be changed to equalize the coupling in these bands. According to the present embodiment, when the directional coupler is used in the low band, the first switching device 140 is turned on and the second switching device 146 is turned off. When the directional coupler is used in the high band, on the other hand, the first switching device 140 is turned off and the second switching device 146 is turned on. It should be noted that the lengths of the first and second coupled lines 142 and 144 are such that the coupling of the directional coupler in the low and high bands can be equalized by the above switching of the first and second switching devices 140 and 146. Thus, the present embodiment allows the coupling of the directional coupler to be equalized in the low and high bands, as in the fifth embodiment.

Figure 22:
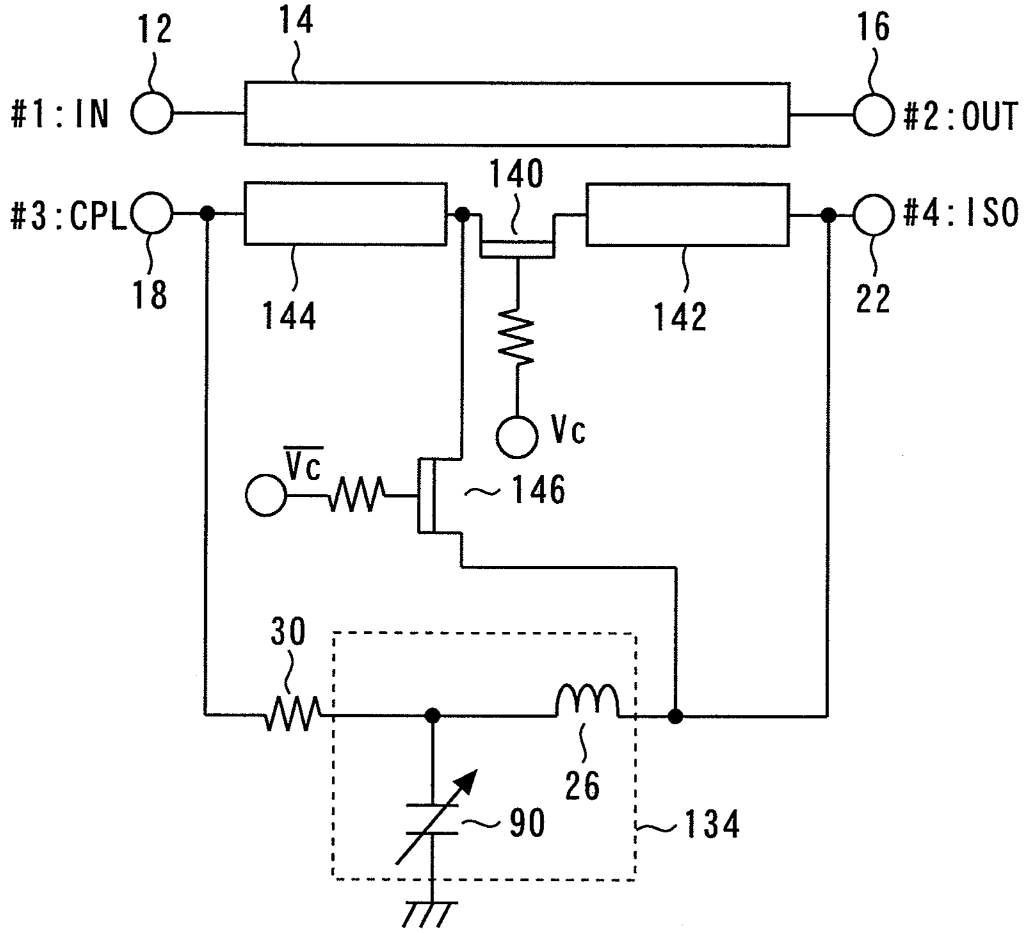
FIG. 22 is a diagram illustrating a directional coupler of the sixth embodiment.

The above switching control for equalizing the coupling of the directional coupler at a plurality of operating frequencies is accomplished by applying a voltage signal Vc and its inverse to the gates of the first and second switching devices 140 and 146. In FIG. 22, the ports connected to the gates of the first and second switching devices 140 and 146 represent the means for controlling Vc and its inverse.

Seventh Embodiment

Figure 23:
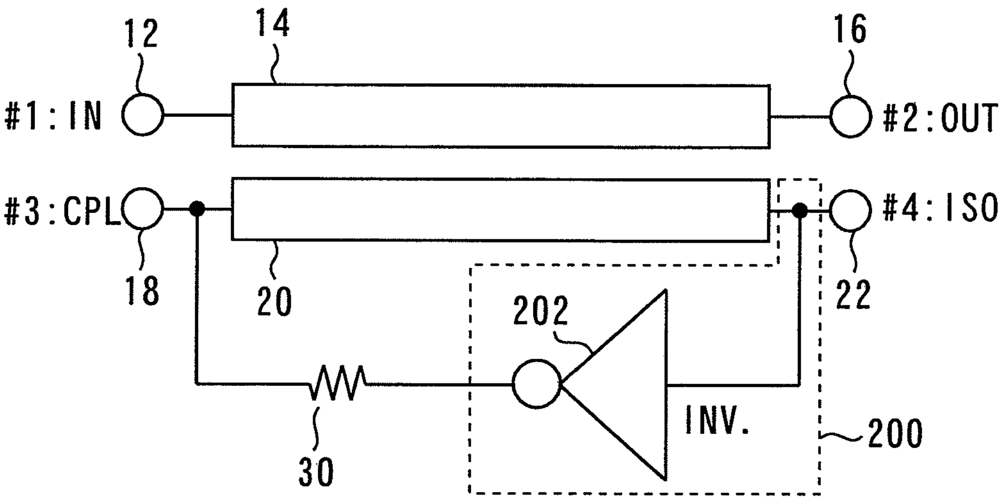
FIG. 23 is a diagram illustrating the directional coupler of the seventh embodiment.

A seventh embodiment of the present invention relates to a directional coupler that includes a phase shifter using a phase inverting amplifier (an active device). The present embodiment will be described with reference to FIGS. 23 to 28. The directional coupler of the present embodiment is substantially similar to that of the first embodiment, except that the phase shifter is made up of a phase inverting amplifier. FIG. 23 is a diagram illustrating the directional coupler of the present embodiment. The phase shifter, 200, of the present embodiment differs from those of the first to sixth embodiments in that it uses a phase inverting amplifier 202 (an active device). This phase inverting amplifier 202 does not amplify the input signal but attenuates it and supplies the attenuated signal to the coupled port.

Generally, a phase inverting amplifier can provide a phase inversion over a wide frequency range. Therefore, like the phase shifters of the embodiments described above, the phase shifter 200 of the present embodiment can phase shift the second reflected wave component such that this reflected wave component is opposite in phase to the first reflected wave component. An important point to note when using an amplifier as the phase shifter is that the amplifier must be designed so as not to cause signal distortion, since excess input tends to result in signal distortion. However, when the directional coupler of the present embodiment is incorporated in a transmission module, the phase inverting amplifier 202 operates at a much lower current than the amplifier (PA) in the preceding stage. Therefore, the chances are low that the current consumption of the phase inverting amplifier will degrade the module characteristics.

The use of a phase inverting amplifier (202) as the phase shifter, as in the present embodiment, is advantageous in reducing the circuit dimensions of the phase shifter. The reason for this is that since the phase inverting amplifier (202) is typically made up of transistors and resistances, it is smaller than the phase shifters of the first to sixth embodiments, which include an inductor and a capacitor.

Figure 24:
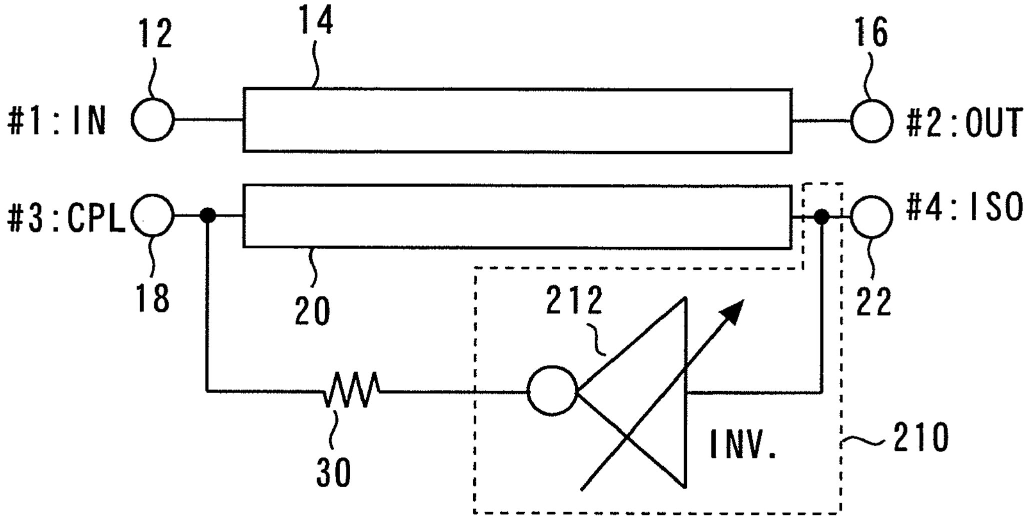
FIG. 24 is a diagram illustrating a variation of the seventh embodiment.

FIG. 24 is a diagram illustrating a variation of the present embodiment. The directional coupler shown in FIG. 24 includes a variable gain phase inverting amplifier 212. Therefore, the gain of the phase inverting amplifier 212 may be varied to attenuate the second reflected wave component such that the first and second reflected wave components have equal amplitudes. That is, this simple configuration of the directional coupler achieves the same advantages as described above in connection with the fourth embodiment.

Figure 25:
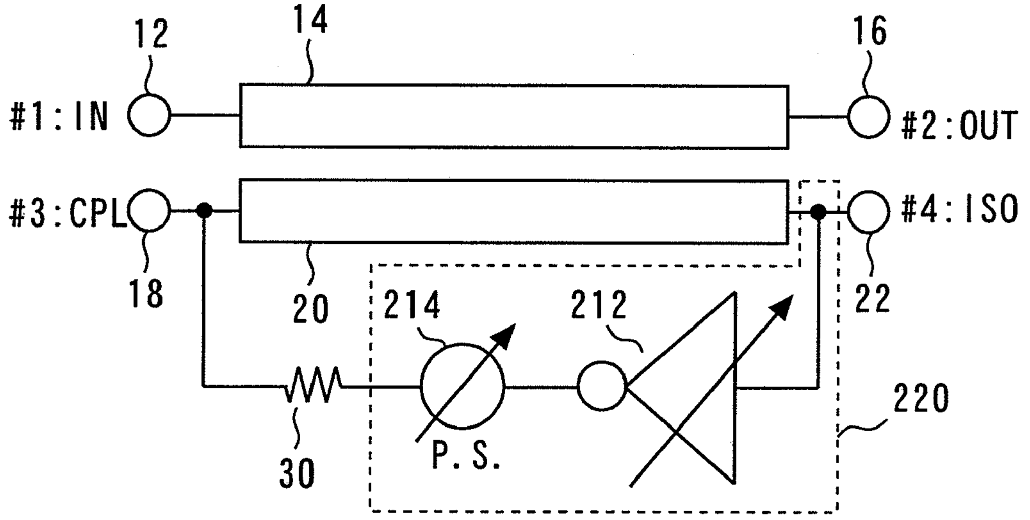
FIG. 25 is a diagram illustrating another variation of the seventh embodiment.

FIG. 25 is a diagram illustrating another variation of the present embodiment. This variation provides a directional coupler for use at a plurality of different frequencies. Specifically, the phase shifter 220 in this directional coupler shown in FIG. 25 includes a variable gain phase inverting amplifier 212 and a variable phase shifter 214. One end of the phase inverting amplifier 212 is connected to the isolated port 22, and the other end is connected to one end of the variable phase shifter 214. The other end of the variable phase shifter 214 is connected to the coupled port 18 through a resistance 30. The variable phase shifter 214 is controlled to shift the frequency range over which the directional coupler has high directivity such that the directional coupler has high directivity at the current operating frequency, thus achieving the same advantages as described above in connection with the second embodiment.

Figure 26:
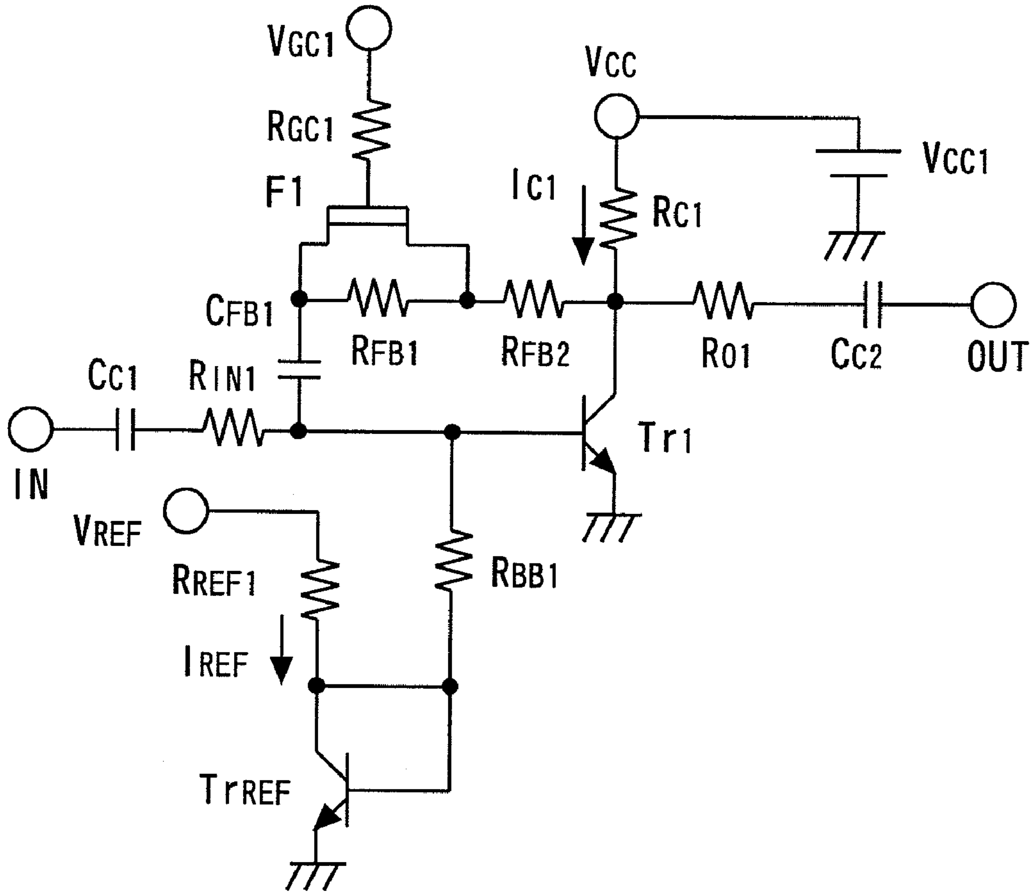
FIG. 26 is a circuit diagram illustrating the configuration of the phase inverting amplifier.

FIG. 26 is a circuit diagram illustrating the configuration of the phase inverting amplifier 212. In FIG. 26, reference numerals Tr1 and TrREF denote HBTs (heterojunction bipolar transistors), F1 denotes an FET (field effect transistor), and Rc1 denotes a load resistance. Reference numerals $R_{FB1}$ and $R_{FB2}$ denote resistances, and $C_{FB1}$ denotes a capacitance. The resistances $R_{FB1}$ and $R_{FB2}$, the capacitance $C_{FB1}$, and the FET F1 form a feedback circuit connected between the base and collector of Tr1. The phase inverting amplifier 212 is a variable gain circuit having attenuation characteristics, as described above. The feedback circuit serves to widen the band and decrease the gain of the phase inverting amplifier 212. The gate voltage $V_{GC1}$ of the FET F1 in the feedback circuit may be controlled to adjust the on resistance of F1 and thereby adjust the amount of feedback and hence the gain of the amplifier. It should be noted that reference numerals $R_{IN1}$ and $R_{01}$ denote gain reducing resistances of the phase inverting amplifier 212. The values of these resistances may be such that the phase inverting amplifier 212 has attenuation characteristics that enable the directional coupler to have high directivity.

The HBTs Tr1 and TrREF form a current mirror. The bias current to Tr1 can be controlled by $V_{REF}$. Since the conductance (gm) of Tr1 is proportional to this bias current, the gain (or the amount of attenuation) of the amplifier can be adjusted by adjusting this bias current.

Figure 27:
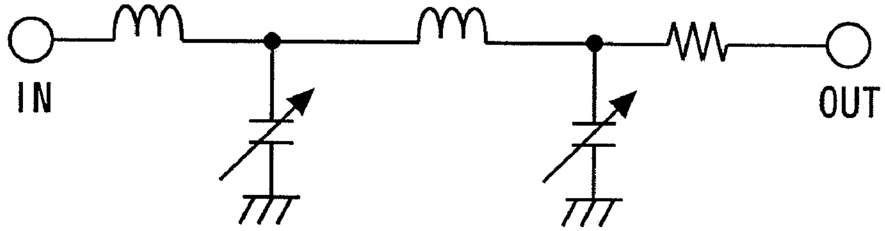
FIG. 27 is a diagram illustrating the configuration of the variable phase shifter.

FIG. 27 is a diagram illustrating the configuration of the variable phase shifter 214 shown in FIG. 25. The variable phase shifter 214 shown in FIG. 27 differs from the phase shifter of FIG. 10 described in connection with the first embodiment in that it includes variable capacitors instead of fixed value capacitors. The use of variable capacitors in the phase shifter (214) and its advantages over fixed value capacitors are the same as those described above in connection with the second embodiment.

Figure 28:
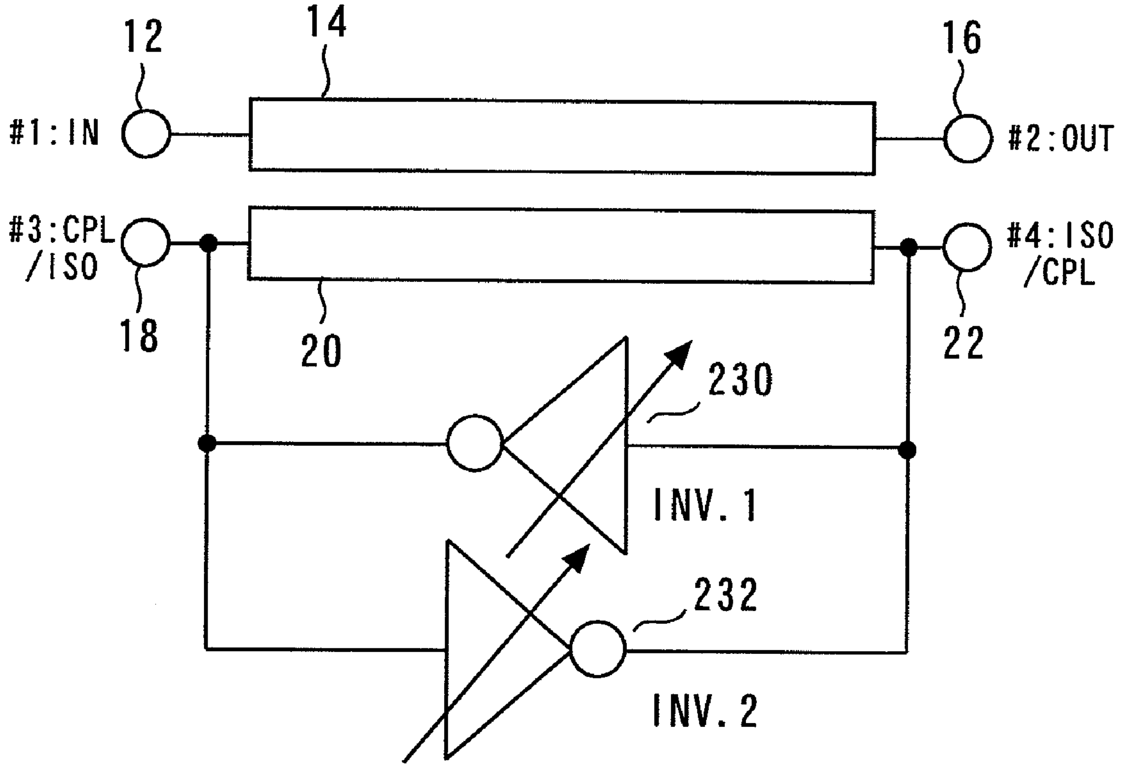
FIG. 28 is a diagram illustrating another variation of the seventh embodiment.

FIG. 28 is a diagram illustrating another variation of the present embodiment. This variation provides a directional coupler adapted for bidirectional power transmission yet having high directivity. The directional coupler shown in FIG. 28 is characterized in that it includes a variable gain phase inverting amplifier 230 and a variable gain phase inverting amplifier 232 serving as phase shifters. This directional coupler is similar to that of FIG. 9 described above in connection with the first embodiment, except that the LC phase shifters are replaced by active devices. Therefore, this simple configuration of the directional coupler achieves the same advantages as described above in connection with the directional coupler shown in FIG. 9.

Eighth Embodiment

An eighth embodiment of the present invention relates to a directional coupler for use in at least a low band and a high band higher in frequency than the low bad in which the coupling can be equalized at different operating frequencies. The present embodiment will be described with reference to FIGS. 29 and 30.

Figure 29:
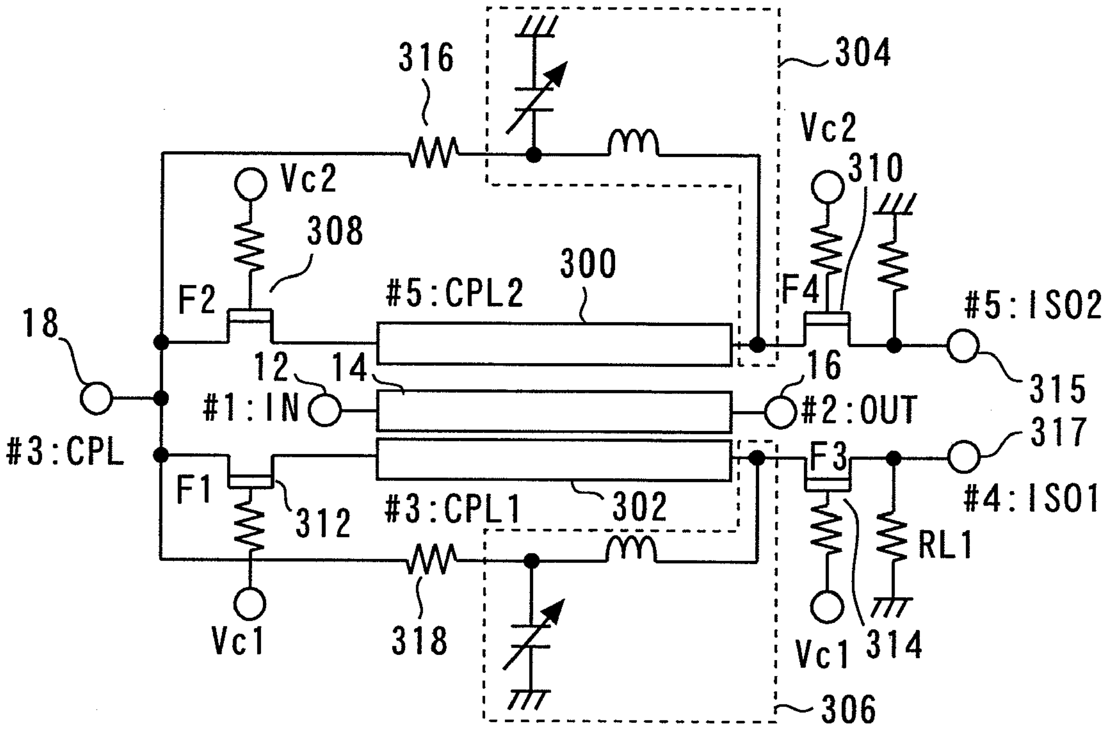
FIG. 29 is a diagram illustrating the directional coupler of the eighth embodiment.

FIG. 29 is a diagram illustrating the directional coupler of the present embodiment. In this directional coupler, different coupled lines are used for different operating frequencies. As shown in FIG. 29, a main line 14 connected between an input port 12 and an output port 16 is sandwiched along its length between a high band coupled line 300 and a low band coupled line 302.

One end of the low band coupled line 302 is connected to a coupled port 18 through a first switching device 312, and the other end is connected to a first isolated port 317 through a third switching device 314. On the other hand, one end of the high band coupled line 300 is connected to the coupled port 18 through a second switching device 308, and the other end is connected to a second isolated port 315 through a fourth switching device 310.

Further, a series connection of a first phase shifter 306 and a resistance 318 is connected in parallel with the low band coupled line 302. A series connection of a second phase shifter 304 and a resistance 316 is connected in parallel with the high band coupled line 300. The first and second phase shifters 306 and 304 each include a variable capacitor. The configurations of the first and second phase shifters 306 and 304 are the same as that of the phase shifter described above in connection with the second embodiment.

When the directional coupler of the present embodiment is used in the low band, the first and third switching devices 312 and 314 are turned on and the second and fourth switching devices 308 and 310 are turned off. When the directional coupler is used in the high band, on the other hand, the first and third switching devices 312 and 314 are turned off and the second and fourth switching devices 308 and 310 are turned on. This on-off control, i.e., the turning on and off of these switching devices, is done by the voltage applying means provided inside or outside the directional coupler. The directional coupler of the present embodiment includes at least voltage applying ports (denoted by Vc1 and Vc2 in FIG. 29) as switching control means for these switching devices.

The low band coupled line 302 is spaced a shorter distance from the main line 14 than is the high band coupled line 300. That is, a relatively small distance is provided between the main line 14 and the low band coupled line 302 to ensure sufficient coupling therebetween when the directional coupler is used in the low band. On the other hand, there is a relatively large distance between the main line 14 and the high band coupled line 300 to compensate for an increase in the coupling between these lines when the directional coupler is used in the high band. Thus, according to the present embodiment, the low and high band coupled lines 302 and 300 are spaced from the main line 14 such that the coupling of the directional coupler is substantially equalized in the low and high frequency bands. Generally, the power detected by the detector (in a subsequent stage) connected to the coupled port is preferably within a predetermined range regardless of the operating frequency in order to ensure sufficient detection accuracy. The present embodiment achieves this by equalizing the coupling of the directional coupler at a plurality of frequencies, thus achieving the advantages described above.

Figure 30:
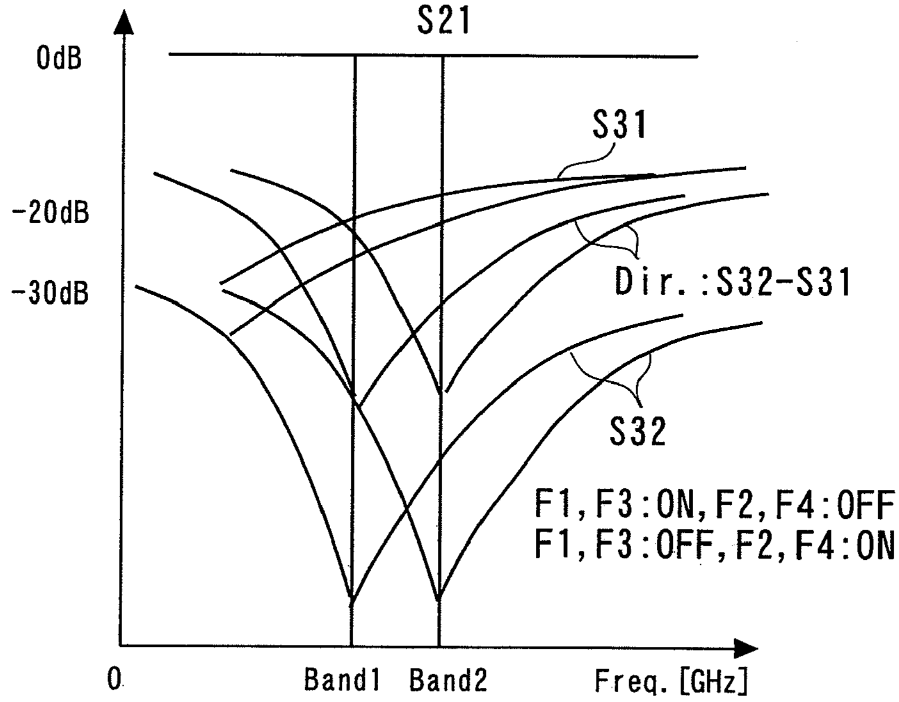
FIG. 30 is a graph illustrating various characteristics of the directional coupler of the eighth embodiment as a function of frequency.

Further, the resonant frequencies (or circuit constants) of the phase shifters 306 and 304 for the low and high bands, respectively, are such that the directional coupler has high directivity in both bands. Thus the present embodiment allows for increasing the directivity of a directional coupler for use at a plurality of frequencies, regardless of the operating frequency, as shown in FIG. 30.

Ninth Embodiment

A ninth embodiment of the present invention relates to a directional coupler for use in at least a low band and a high band higher in frequency than the low band in which the coupling can be equalized at different operating frequencies. The present embodiment will be described with reference to FIGS. 31 and 32.

Figure 31:
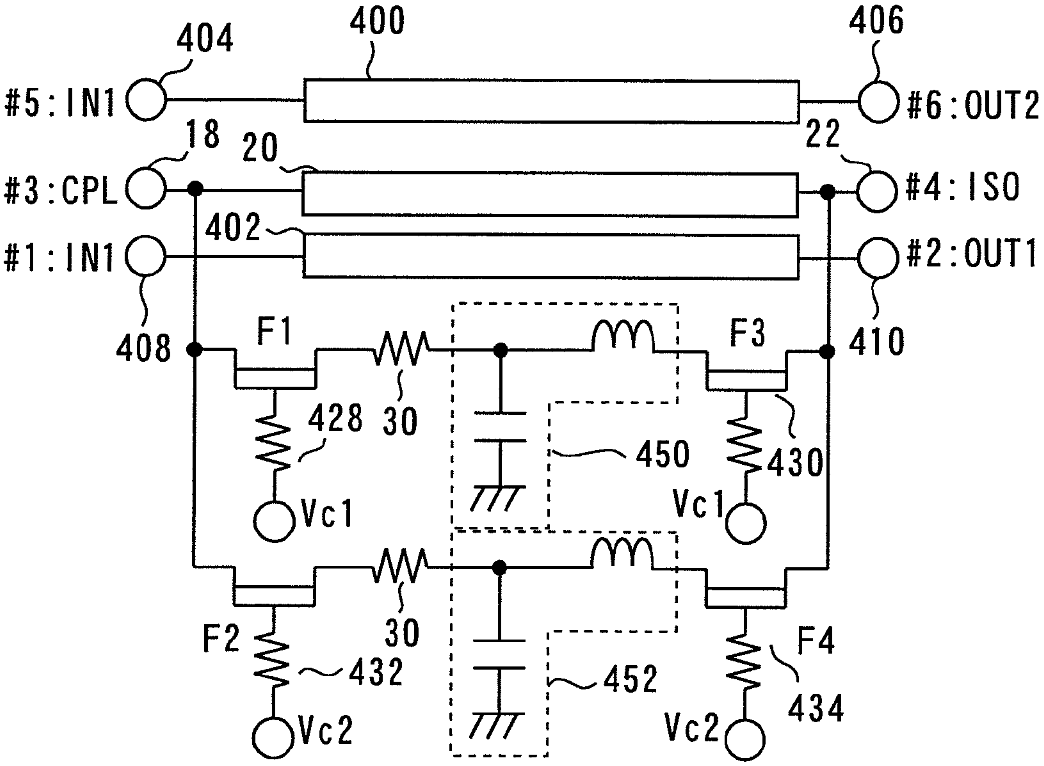
FIG. 31 is a diagram illustrating the directional coupler of the ninth embodiment.
Figure 32:
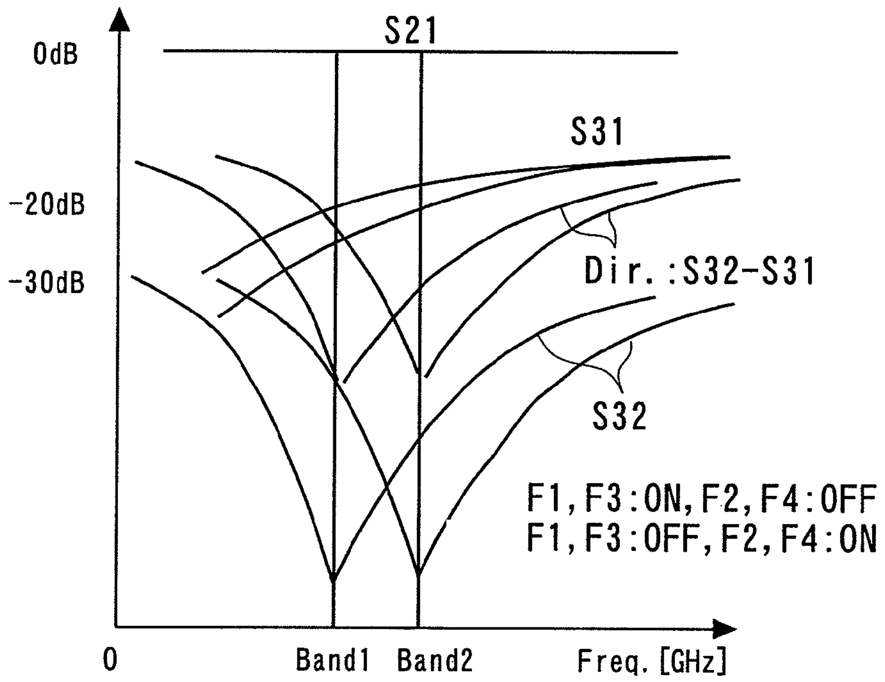
FIG. 32 is a graph illustrating various characteristics of the directional coupler of the ninth embodiment as a function of frequency.

FIG. 31 is a diagram illustrating the directional coupler of the present embodiment. In this directional coupler, different main lines are used for different operating frequencies. As shown in FIG. 31, a coupled line 20 connected between a coupled port 18 and an isolated port 22 is sandwiched along its length between a high band main line 400 and a low band main line 402.

One end of the high band main line 400 is connected to a high band input port 404, and the other end is connected to a high band output port 406. On the other hand, one end of the low band main line 402 is connected to a low band input port 408, and the other end is connected to a low band output port 410.

The directional coupler of the present embodiment, like that of the first embodiment, includes a phase shifter connected at one end to the coupled port 18 and at the other end to the isolated port 22. This phase shifter includes a high band phase shifter 450 and a low band phase shifter 452. One end of the high band phase shifter 450 is connected to the isolated port 22 through a third switching device 430, and the other end is connected to the coupled port 18 through a resistance 30 and a first switching device 428. On the other hand, one end of the low band phase shifter 452 is connected to the isolated port 22 through a fourth switching device 434, and the other end is connected to the coupled port 18 through another resistance 30 and a second switching device 432.

When the directional coupler of the present embodiment is used in the low band, the second and fourth switching devices 432 and 434 are turned on and the first and third switching devices 428 and 430 are turned off. When the directional coupler is used in the high band, on the other hand, the first and third switching devices 428 and 430 are turned on and the second and fourth switching devices 432 and 434 are turned off. This on-off control, i.e., the turning on and off of these switching devices, is done by the voltage applying means provided inside or outside the directional coupler. The directional coupler of the present embodiment includes at least voltage applying ports (denoted by Vc1 and Vc2 in FIG. 31) as switching control means for these switching devices.

The low band main line 402 is spaced a shorter distance from the coupled line 20 than is the high band main line 400. That is, the distances between the coupled line and these main lines are adjusted to equalize the coupling of the directional coupler in the low and high bands. Further, the directional coupler of the present embodiment also includes a low band phase shifter 452 and a high band phase shifter 450 each for a different operating frequency. The use of these phase shifters allows the directional coupler to have high directivity regardless of the operating frequency (see FIG. 32). Thus the present embodiment achieves the same advantages as described above in connection with the eighth embodiment. Since the directional coupler of the present embodiment includes two main lines, it is suitable for use in GSM (Global-System-for-Mobile-communications) terminals, or GSM transmission modules, which include two PAs (amplifiers) in a stage preceding the directional coupler and also include two output lines.

Tenth Embodiment

Figure 33:
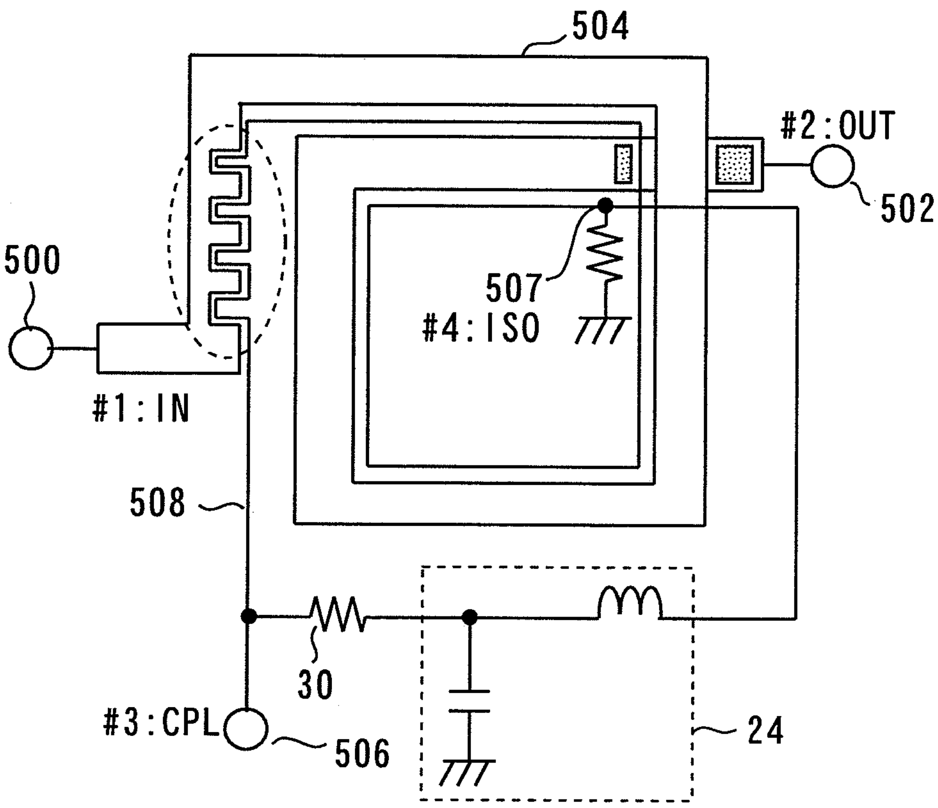
FIG. 33 is a diagram illustrating the directional coupler of the tenth embodiment.

A tenth embodiment of the present invention relates to a directional coupler which includes a phase shifter and which is adapted to compensate for the reduction in the coupling due to the incorporation of the phase shifter. The present embodiment will be described with reference to FIGS. 33 to 35. FIG. 33 is a diagram illustrating the directional coupler of the present embodiment. As shown in FIG. 33, the main line 504 of the present embodiment is formed in a spiral shape. One end of the main line 504 is connected to an input port 500, and the other end is connected to an output port 502. A coupled line 508 of a spiral shape is formed along the spiral main line 504. The coupled line 508 is connected at one end to a coupled port 506 and at the other end to an isolated port 507, as in the first embodiment.

Figure 34:
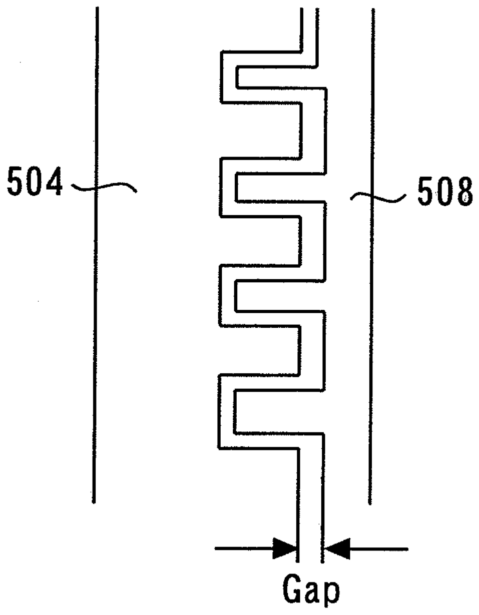
FIG. 34 is an enlarged view of the portion of FIG. 33 within the dashed circle.

The main line 504 and the coupled line 508 each have a comb-shaped portion, shown encircled by dashed line in FIG. 33. FIG. 34 is an enlarged view of the portion of FIG. 33 within the dashed circle. The comb-shaped portions of the main line 504 and the coupled line 508 are interdigitated with and spaced apart from each other, as shown in FIG. 34. The main line 504 and the coupled line 508 are spaced a predetermined distance from each other.

The directional coupler of the present embodiment includes a phase shifter 24. The configuration of the phase shifter 24 is the same as in the first embodiment. One end of the phase shifter 24 is connected to the isolated port 507, and the other end is connected to the coupled port 506 through a resistance 30.

Figure 35:
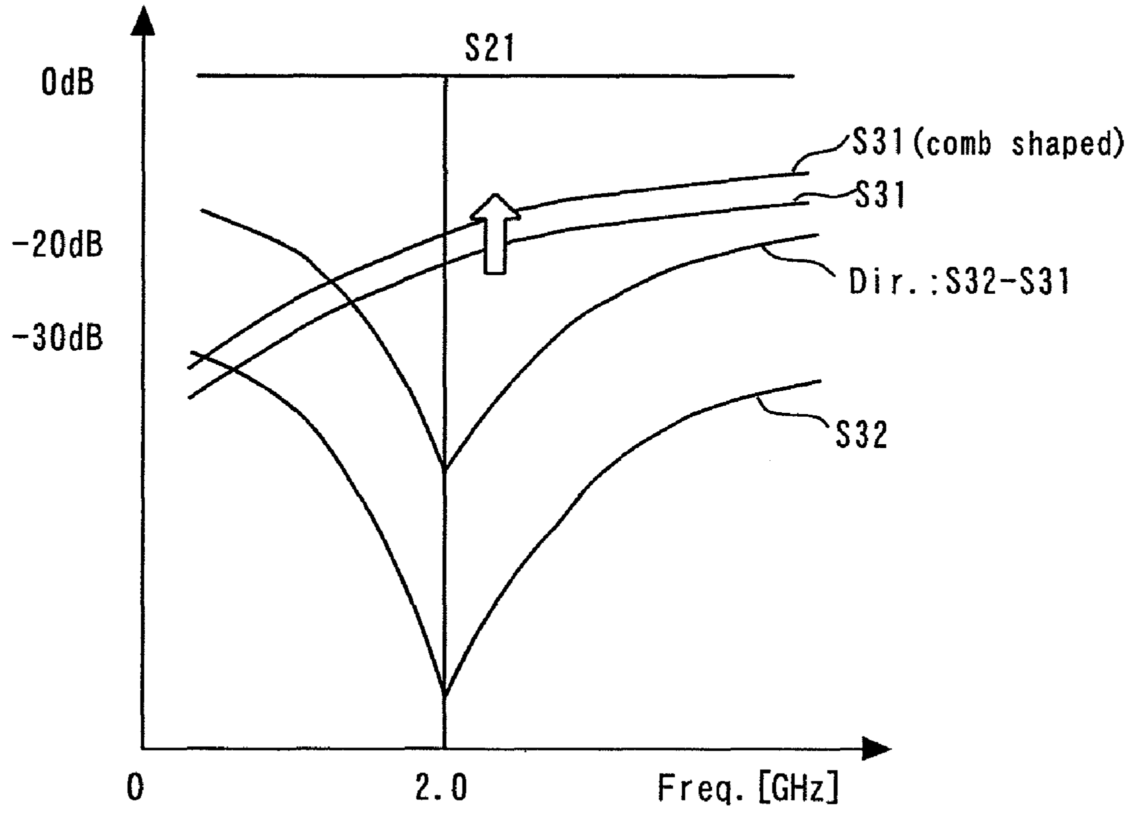
FIG. 35 shows the difference in coupling (S31) between when the main line and the coupled line have a comb-shaped portion and when they do not have a comb-shaped portion.
Figure 36:
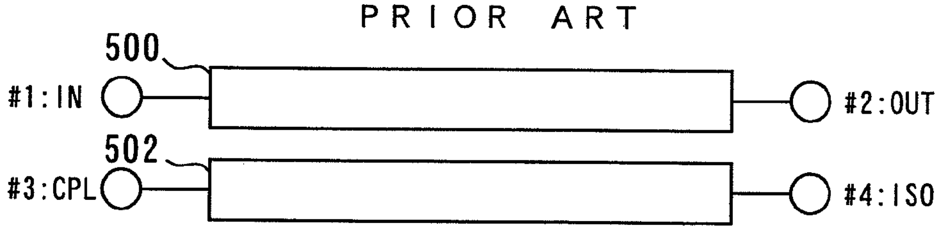
FIG. 36 PRIOR ART
FIG. 36 shows a typical configuration of a directional coupler.
Figure 37:
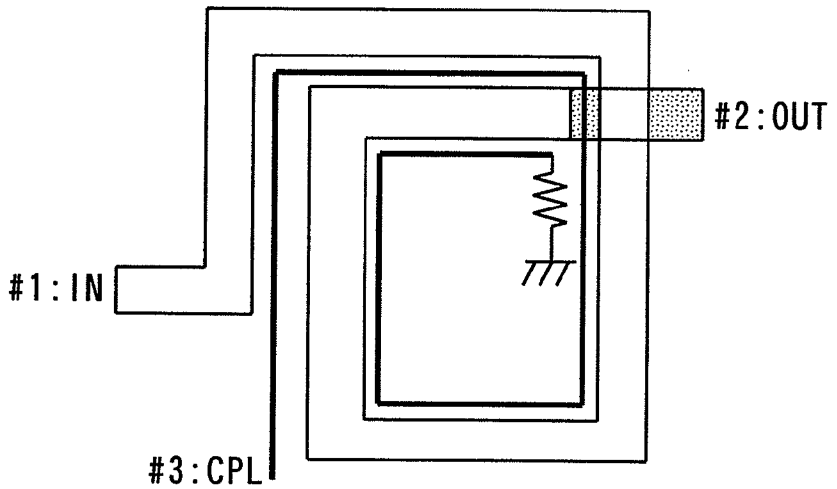
FIG. 37 PRIOR ART
FIG. 37 shows directional coupler having spiral shape.
Figure 38:
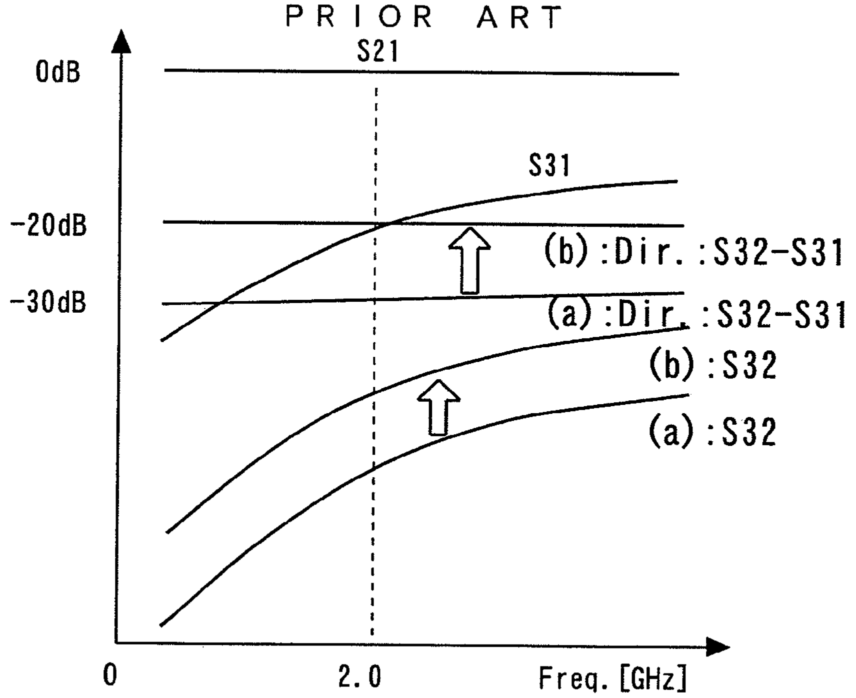
FIG. 38 is a graph illustrating various characteristics of the general directional coupler as a function of frequency.
Figure 39:
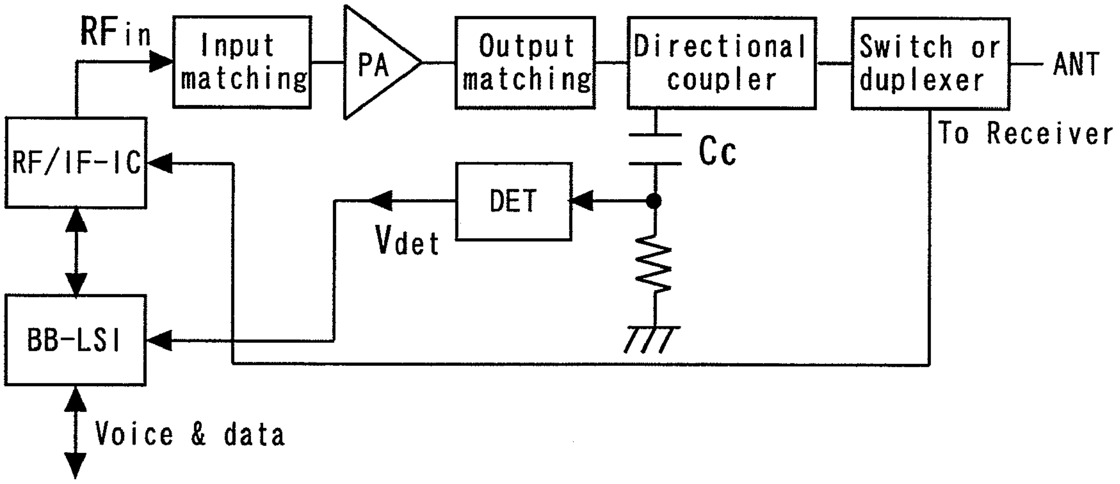
FIG. 39 shows a directional coupler inserted between a transmit power amplifier and an antenna, and used in a cellular phone unit.
Figure 40:
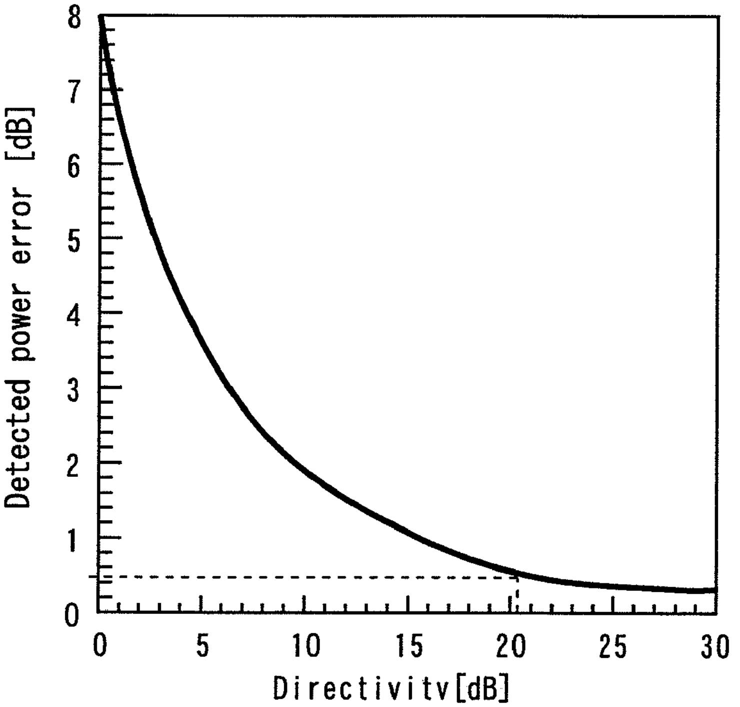
FIG. 40 is a graph showing the relationship between the directivity of the directional coupler and the error in the power measurement by the detector.

The incorporation of a phase shifter (such as the phase shifter 24) into a directional coupler may result in reduced coupling and hence reduced directivity. The present inventors have found, through experiments, that a directional coupler without a phase shifter has a coupling of approximately −20 dB, and the same directional coupler has a coupling of approximately −23 dB when provided with a phase shifter. According to the present embodiment, the main line 504 and the coupled line 508 have a comb-shaped portion at which the electric field is concentrated, making it possible to increase the coupling of the directional coupler without increasing its size. Further, since the main line 504 and the coupled line 508 are of a spiral shape, the coupling length can be increased without increasing the size of the directional coupler. Therefore, the present embodiment allows compensation for the reduction in the coupling of the directional coupling due to the incorporation of the phase shifter, thereby maintaining the directivity at a high level. FIG. 35 shows the difference in coupling (S31) between when the main line 504 and the coupled line 508 have a comb-shaped portion and when they do not have a comb-shaped portion.

Although in the present embodiment the facing portions of the main line 504 and the coupled line 508 are partially formed in a comb shape, it is to be understood that the entire facing portions may be formed in a comb shape in order to increase the coupling. On the other hand, only small portions of the facing portions may be formed in a comb shape if this still provides sufficient coupling.

Thus the present invention enables the manufacture of a directional coupler of small size yet having high directivity.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2009-000874, filed on Jan. 6, 2009 including specification, claims, drawings and summary, on which the Convention priority of the present application is based, are incorporated herein by reference in its entirety.

What is claimed is:

1. A directional coupler comprising:

a substrate;

a main line on said substrate and connected at a first end to an input port and at a second end to an output port;

a coupled line on said substrate and extending along said main line, said coupled line being connected at a first end to a coupled port and at a second end to an isolated port, said first end of said coupled line and said input port being located at a first side of said directional coupler, said second end of said coupled line and said output port being located at a second side of said directional coupler; and a phase shifter connected at a first end to said isolated port and at a second end to said coupled port, wherein coupling length between said main line and said coupled line is shorter than one-quarter wavelength of the frequency of power transmitted from said input port to said output port, and said phase shifter phase shifts a second reflected wave component such that the second reflected wave component is opposite in phase to a first reflected wave component, the second reflected wave component traveling from said output port to said coupled port through said isolated port and said phase shifter, and the first reflected wave component traveling from said output port to said coupled port through said coupled line.

2. The directional coupler according to claim 1, wherein:

said phase shifter includes an inductor and a capacitor, said inductor being connected at a first end to said isolated port and at a second end to said coupled port, and said capacitor being connected at a first end to said second end of said inductor and at a second end to ground; and the resonant frequency of said phase shifter is such that the second reflected wave component is opposite in phase to the first reflected wave component.

3. The directional coupler according to claim 2, wherein:

said directional coupler is usable at a plurality of different frequencies; and said capacitor is a variable capacitor for varying the resonant frequency of said phase shifter to increase directivity of the directional coupler at said plurality of different frequencies, one frequency at a time.

4. The directional coupler according to claim 3, wherein said variable capacitor includes a diode and voltage applying means, said diode having an anode connected to ground and a cathode connected to said second end of said inductor, said voltage applying means being connected to said cathode and applying a voltage to said cathode to vary the resonant frequency.

5. The directional coupler according to claim 2, wherein:

said directional coupler is usable at a plurality of different frequencies; and said inductor is a variable inductor for varying the resonant frequency of said phase shifter to increase directivity of the directional coupler at the plurality of different frequencies, one frequency at a time.

6. The directional coupler according to claim 2, wherein said inductor is a transformer.

7. The directional coupler according to claim 1, wherein:

said second end of said phase shifter is connected to said coupled port through a resistance; and said resistance has a resistance value such that the second reflected wave component is attenuated so that the first reflected wave component and the second reflected wave component have equal amplitudes.

8. The directional coupler according to claim 7, wherein said resistance is a variable resistance set such that the first and second reflected wave components have equal amplitudes.

9. The directional coupler according to claim 1, includes a field effect transistor having a source-drain current path and voltage applying means, wherein:

said directional coupler is usable at a plurality of different frequencies;

the source-drain current path of said field effect transistor is connected between said main line and said coupled line; and said voltage applying means applies a voltage to a gate of said field effect transistor to equalize the coupling of said directional coupler at the plurality of different frequencies.

10. The directional coupler according to claim 1, including first and second switching devices wherein:

said directional coupler is usable in at least a low band and a high band, higher in frequency than the low band;

said coupled line includes a first coupled line and a second coupled line connected to each other through said first switching device;

a first end of said first coupled line is connected to said isolated port;

a second end of said first coupled line is connected to a first end of said first switching device;

a first end of said second coupled line is connected to a second end of said first switching device;

a second end of said second coupled line is connected to said coupled port;

said first end of said phase shifter is connected to said first end of said second coupled line through said second switching device; and said directional coupler further comprises control means for equalizing the coupling of said directional coupler in the low band and the high band so that when said directional coupler is used in the low band, said first switching device is turned on and said second switching device is turned off, and when said directional coupler is used in the high band, said first switching device is turned off and said second switching device is turned on.

11. The directional coupler according to claim 1, wherein said phase shifter is a phase inverting amplifier having an input connected to said isolated port and an output connected to said coupled port.

12. The directional coupler according to claim 1, wherein:

said phase shifter includes a variable gain phase inverting amplifier having an output connected to said insolated port and an output connected to said coupled port; and gain of said phase inverting amplifier is set such that the first and second reflected wave components have equal amplitudes.

13. The directional coupler according to claim 11, including a variable phase shifter wherein:

said directional coupler is usable at a plurality of different frequencies;

said output of said phase inverting amplifier is connected to said coupled port through said variable phase shifter;

said variable phase shifter includes an inductor and a variable capacitor, said inductor being connected at a first end to said output of said phase inverting amplifier and at a second end to said coupled port, said variable capacitor being connected at a first end to said second end of said inductor and at said second end to ground, said variable capacitor varying the resonant frequency of said variable phase shifter to increase directivity of said directional coupler at the plurality of different frequencies, one frequency at a time; and the resonant frequency of said variable phase shifter is adjusted so that the second reflected wave component is opposite in phase to the first reflected wave component.

14. The directional coupler according to claim 1, including first, second, third, and fourth switching devices, wherein:

said directional coupler is usable in at least a low band and a high band, higher in frequency than the low band;

said coupled line includes a low band coupled line and a high band coupled line that lie along said main line and sandwich said main line;

said coupled port is connected to a first end of said low band coupled line through said first switching device and also connected to a first end of said high band coupled line through said second switching device;

said directional coupler further comprises a first isolated port connected to a second end of said low band coupled line through said third switching device;

said directional coupler further comprises a second isolated port connected to =other a second end of said high band coupled line through said fourth switching device;

said directional coupler further comprises control means for controlling frequencies so that when said directional coupler is used in the low band, said first and third switching devices are turned on and said second and fourth switching devices are turned off, and so that when said directional coupler is used in the high band, said first and third switching devices are turned off and said second and fourth switching devices are turned on;

said phase shifter includes a first phase shifter and a second phase shifter, said first phase shifter being connected at a first end to said first isolated port and at a second end to said coupled port, said second phase shifter being connected at a first end to said second isolated port and at a second end to said coupled port; and said low band coupled line is spaced a shorter distance from said main line than is said high band coupled line so that coupling between said main line and said low band coupled line is equal to coupling between said main line and said high band coupled line.

15. The directional coupler according to claim 1, including first, second, third, and fourth switching devices, wherein:

said directional coupler is usable in at least a low band and a high band, higher in frequency than the low band;

said main line includes a low band main line and a high band main line that sandwich said coupled line, said low band main line being connected at a first end to a low band input port and at a second end to a low band output port, said high band main line being connected at a first end to a high band input port and at a second end to a high band output port;

said phase shifter includes a low band phase shifter and a high band phase shifter, said low band phase shifter being connected at a first end to said coupled port through said first switching device and connected at a second end to said isolated port through said second switching device, said high band phase shifter being connected at a first end to said coupled port through said third switching device and connected at a second end to said isolated port through said fourth switching device; and said directional coupler further comprises control means for turning on said first and second switching devices and turning off said third and fourth switching devices when said directional coupler is used in the low band, and for turning off said first and second switching devices and turning on said third and fourth switching devices when said directional coupler is used in the high band.

16. The directional coupler according to claim 1, wherein:

said main line and said coupled line are spiral in shape; and said main line and said coupled line have facing portions having a comb shape.

* * * * *